US011333549B2

(12) United States Patent
Ito et al.

(10) Patent No.: US 11,333,549 B2
(45) Date of Patent: May 17, 2022

(54) AVALANCHE PHOTODIODE SENSOR

(71) Applicant: SONY SEMICONDUCTOR SOLUTIONS CORPORATION, Kanagawa (JP)

(72) Inventors: Kyosuke Ito, Kanagawa (JP); Toshifumi Wakano, Kanagawa (JP); Yusuke Otake, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/462,471

(22) PCT Filed: Sep. 3, 2018

(86) PCT No.: PCT/JP2018/032637
§ 371 (c)(1),
(2) Date: May 20, 2019

(87) PCT Pub. No.: WO2019/082513
PCT Pub. Date: May 2, 2019

(65) Prior Publication Data
US 2020/0249083 A1 Aug. 6, 2020

(30) Foreign Application Priority Data
Oct. 26, 2017 (JP) .............................. JP2017-206729

(51) Int. Cl.
*G01J 1/44* (2006.01)
*H01L 31/107* (2006.01)

(52) U.S. Cl.
CPC .............. *G01J 1/44* (2013.01); *H01L 31/107* (2013.01); *G01J 2001/4466* (2013.01)

(58) Field of Classification Search
CPC .... G01J 1/44; G01J 2001/4466; H01L 31/107
See application file for complete search history.

(56) References Cited

U.S. PATENT DOCUMENTS 9,209,336 B2 * 12/2015 Sanfilippo ............. H01L 31/107
2014/0291486 A1 * 10/2014 Nagano ............ H01L 27/14658
250/208.2

(Continued)

FOREIGN PATENT DOCUMENTS

JP 2013-030511 2/2013
WO WO 2008/113067 9/2008

OTHER PUBLICATIONS

Official Action (with English translation) for Japanese Patent Application No. 2017-206729, dated Nov. 4, 2020, 6 pages.

(Continued)

*Primary Examiner* — Georgia Y Epps
*Assistant Examiner* — Don J Williams
(74) *Attorney, Agent, or Firm* — Sheridan Ross P C.

(57) ABSTRACT

An avalanche photodiode sensor includes a photoelectric conversion region disposed in a substrate and that converts incident light into electric charge. The avalanche photodiode sensor includes a first region of a first conductivity type on the photoelectric conversion region, and a cathode disposed in the substrate adjacent to the first region and coupled to the photoelectric conversion region. The avalanche photodiode sensor includes an anode disposed in the substrate adjacent to the cathode, and a contact of the first conductivity type disposed in the substrate. An impurity concentration of the first region is different than an impurity concentration of the contact.

17 Claims, 22 Drawing Sheets

(56) References Cited

U.S. PATENT DOCUMENTS

2015/0054111 A1  2/2015  Niclass et al.
2016/0351743 A1* 12/2016  Yu ..................... G02B 6/12004

OTHER PUBLICATIONS

Resetar et al., "Development of Gated Pinned Avalanche Photodiode Pixels for High-Speed Low-Light Imaging," Sensors, vol. 16, No. 8, Aug. 2016, 12 pages.
Takai et al., "Single-Photon Avalanche Diode with Enhanced NIR-Sensitivity for Automotive LIDAR Systems," Sensors, vol. 16, No. 4, Mar. 2016, 9 pages.
International Search Report and Written Opinion prepared by the European Patent Office dated Nov. 27, 2018, for International Application No. PCT/JP2018/032637.

* cited by examiner

[Fig. 1]
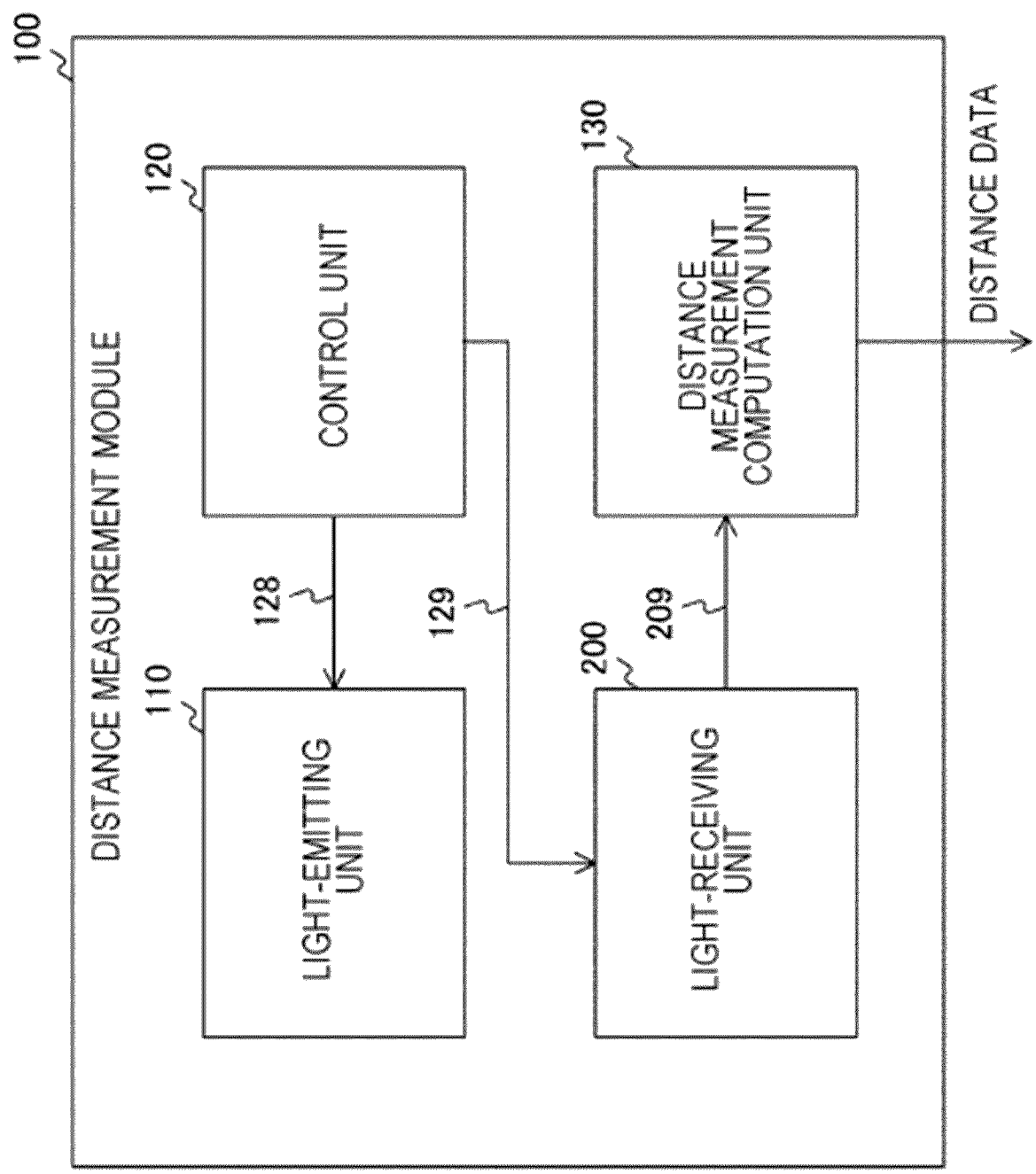

[Fig. 2]
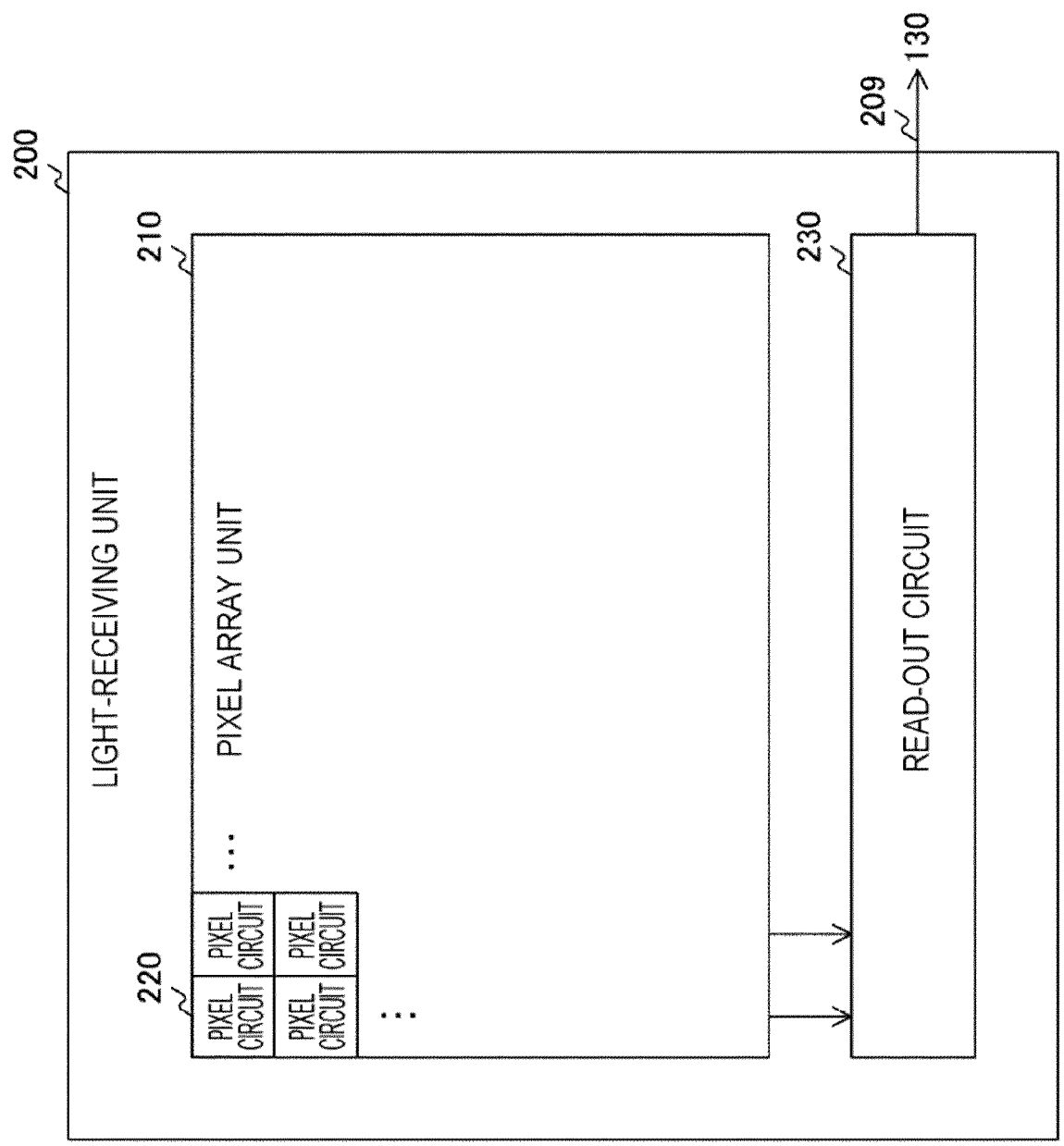

[Fig. 3]
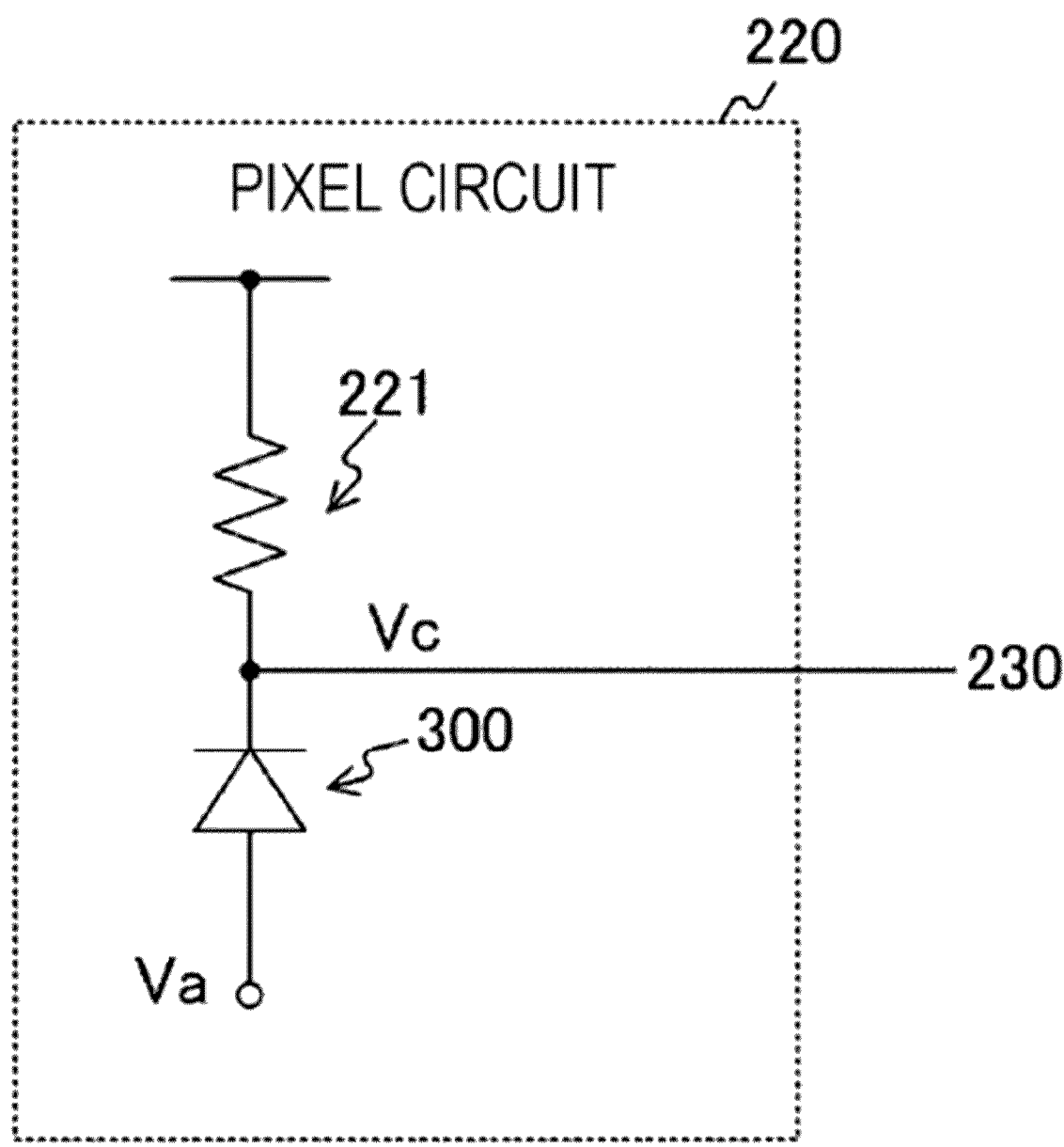

[Fig. 4]
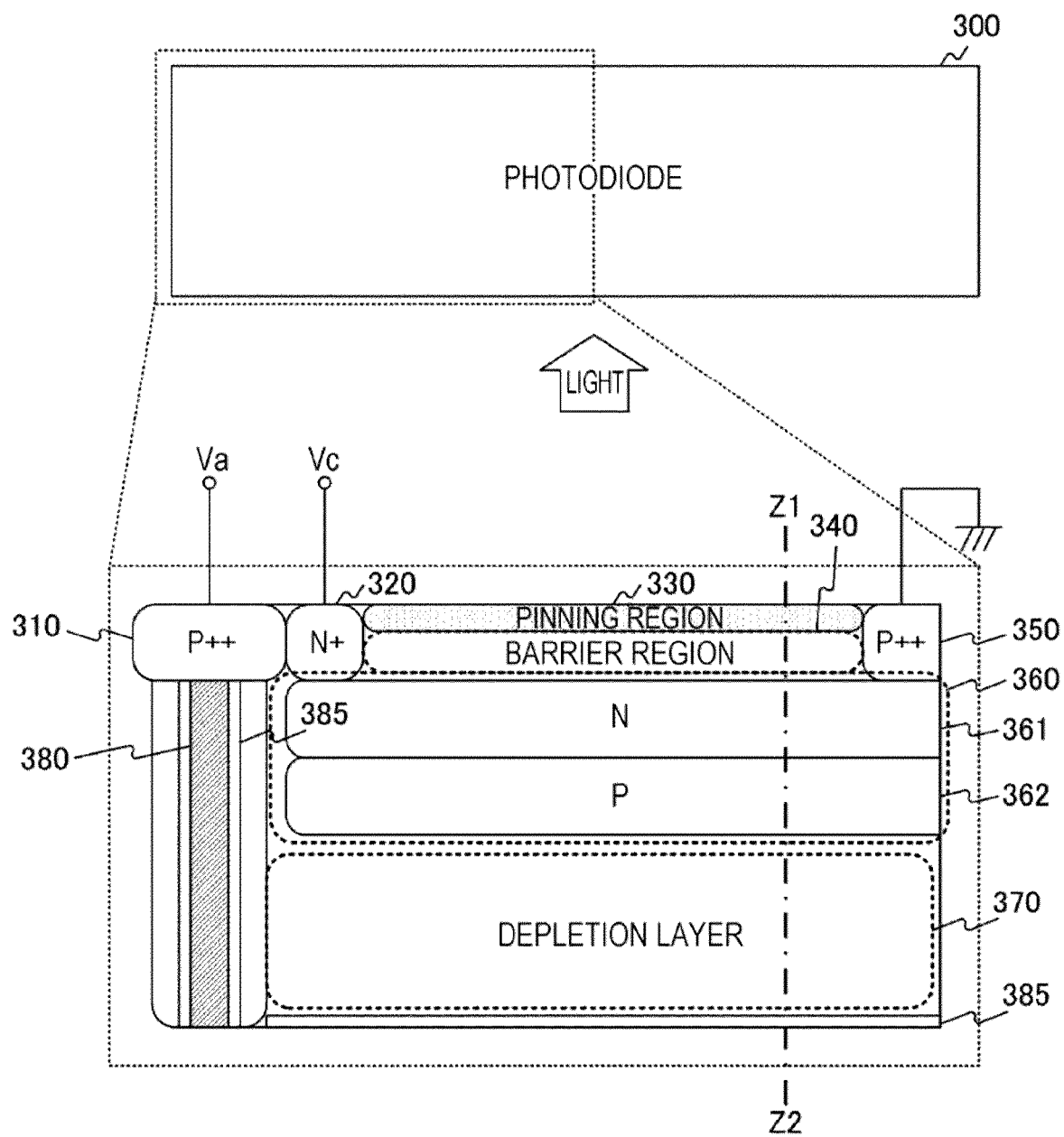

[Fig. 5]
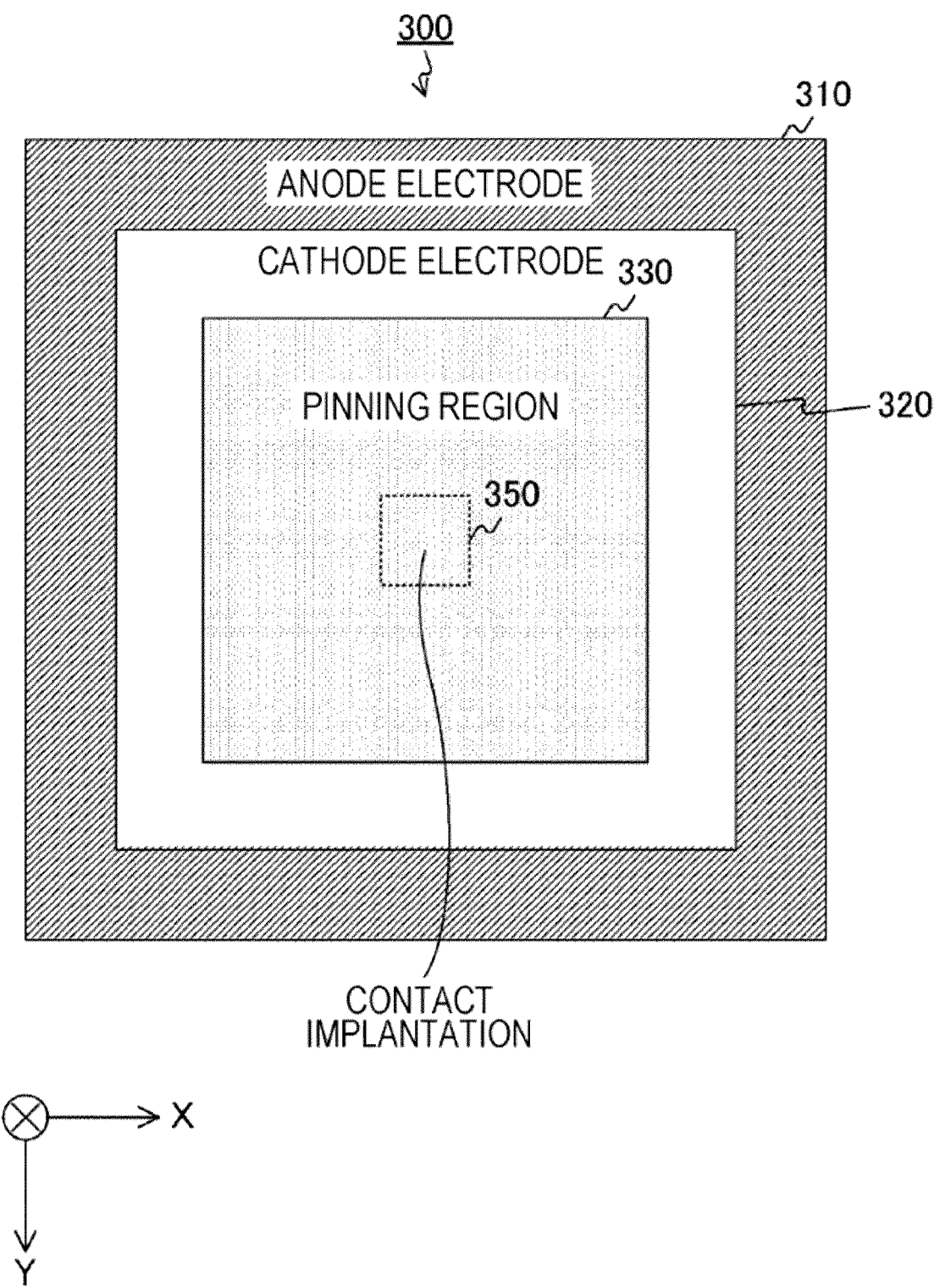

[Fig. 6]
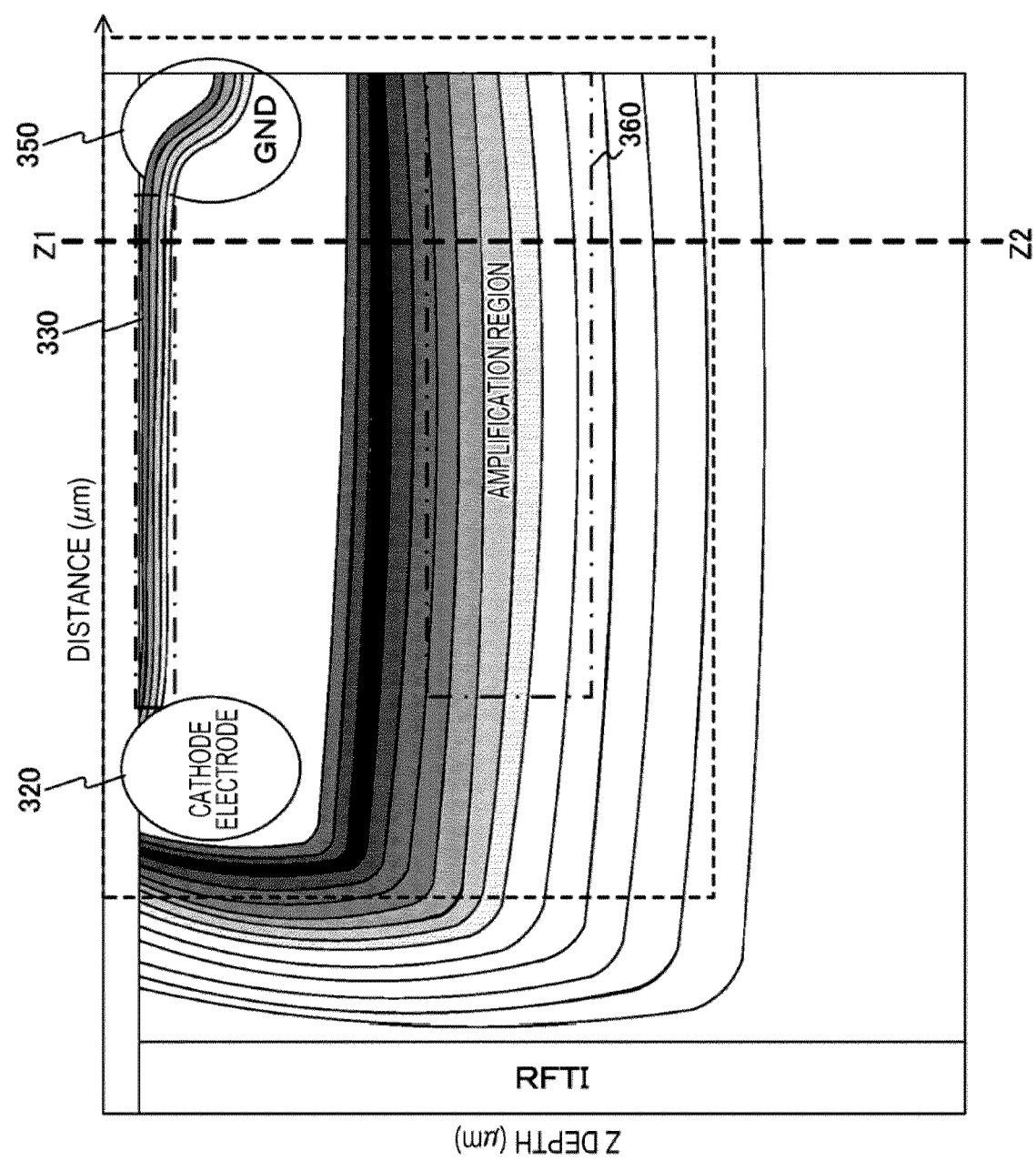

[Fig. 7]
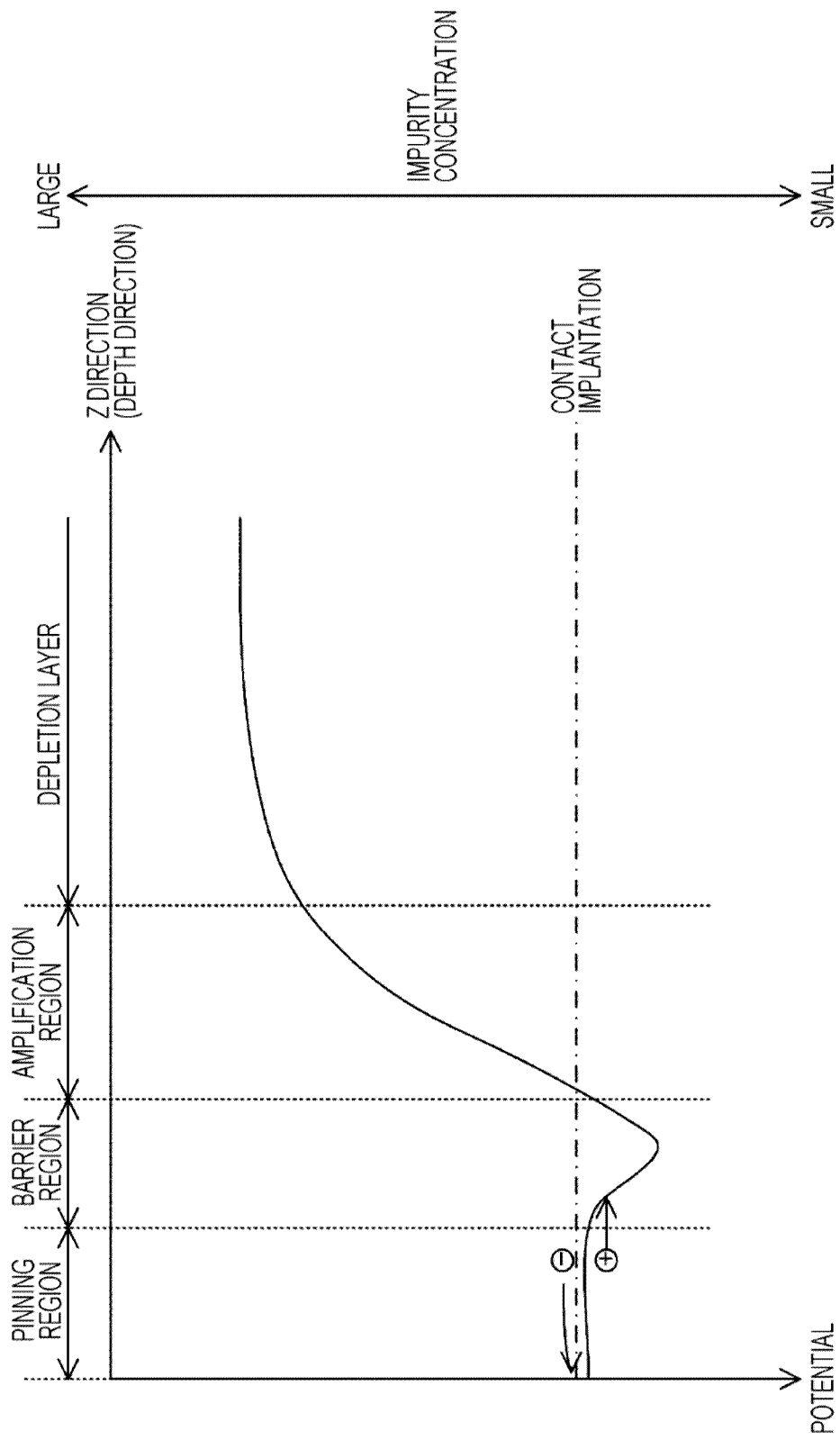

[Fig. 8]
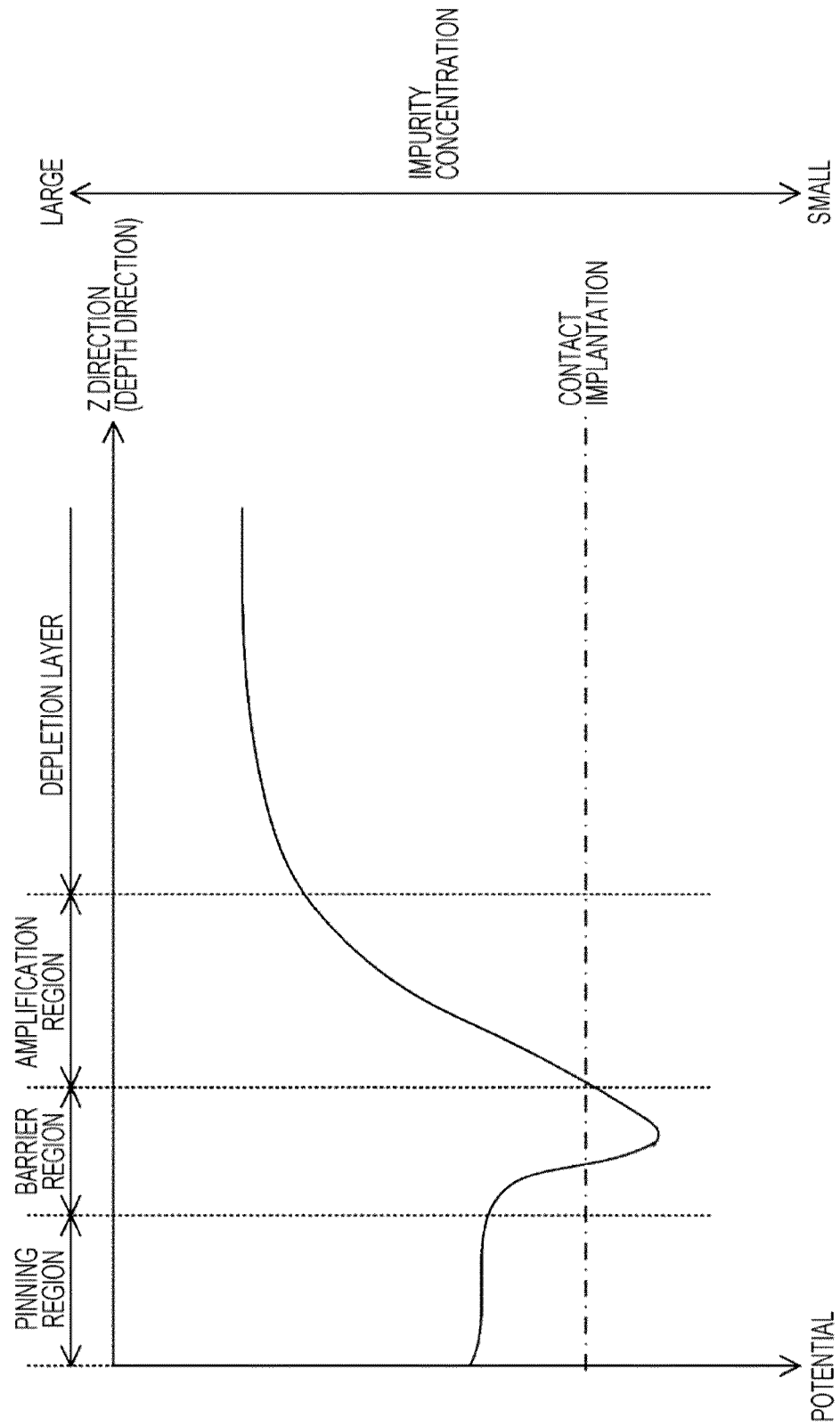

[Fig. 9]
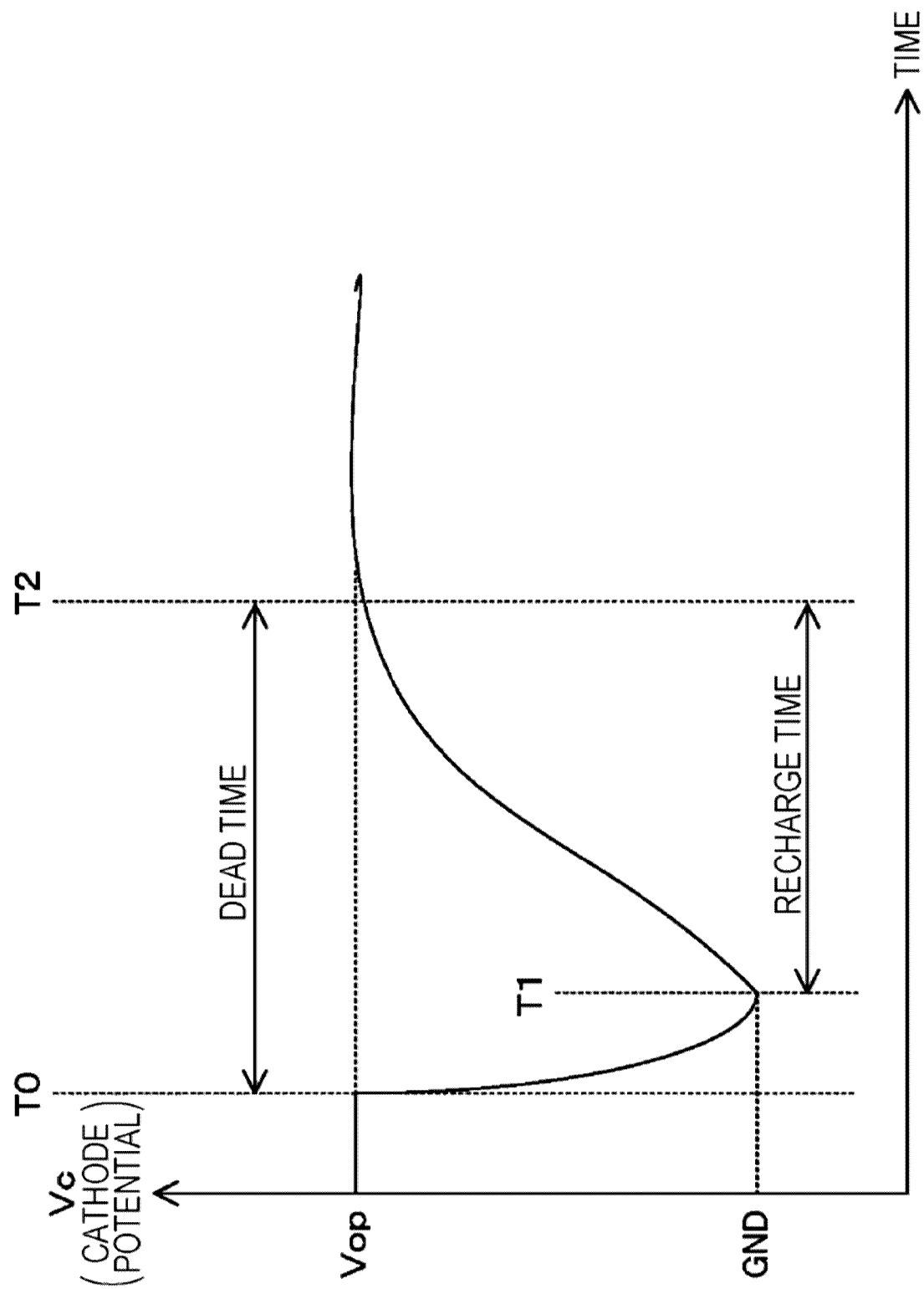

[Fig. 10]
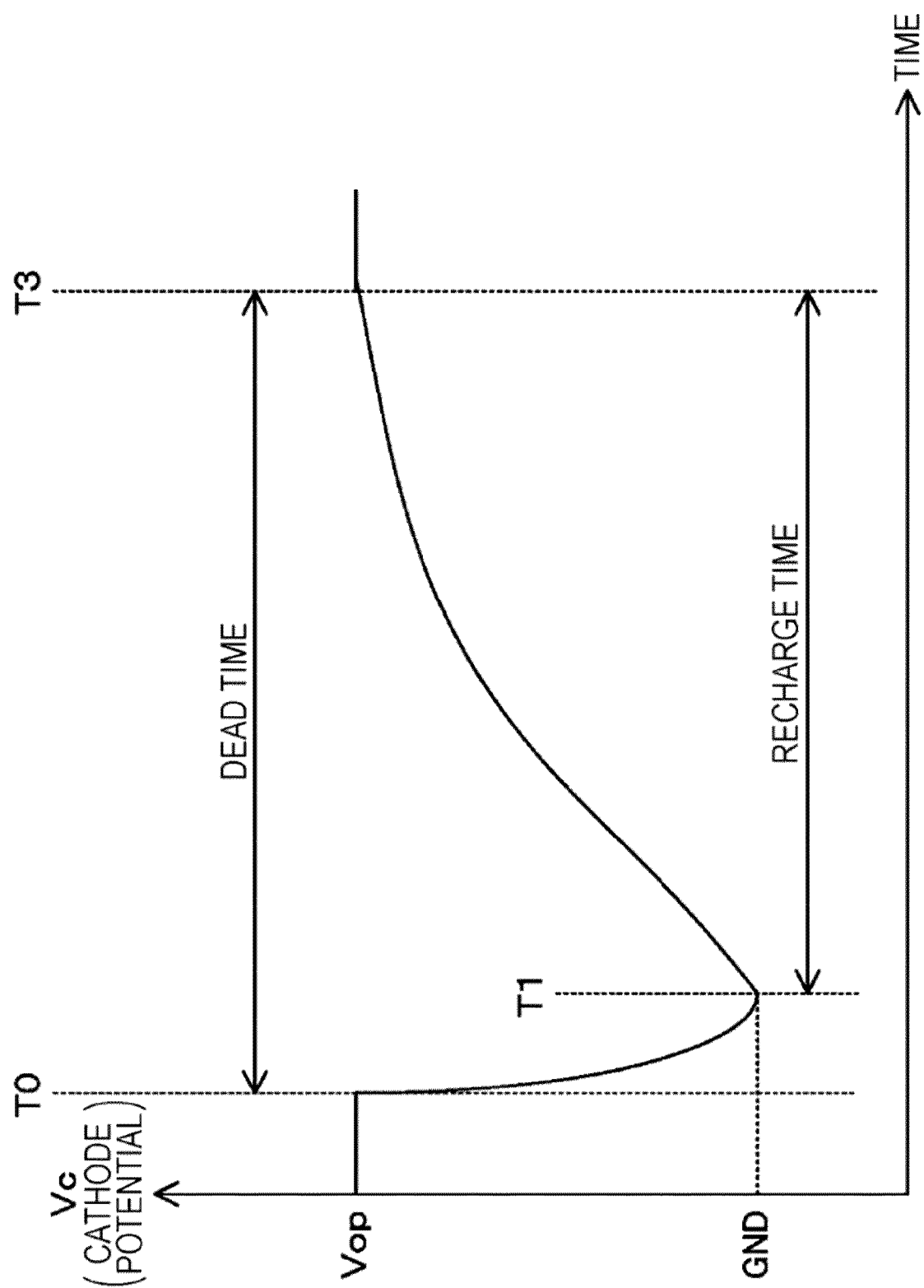

[Fig. 11]
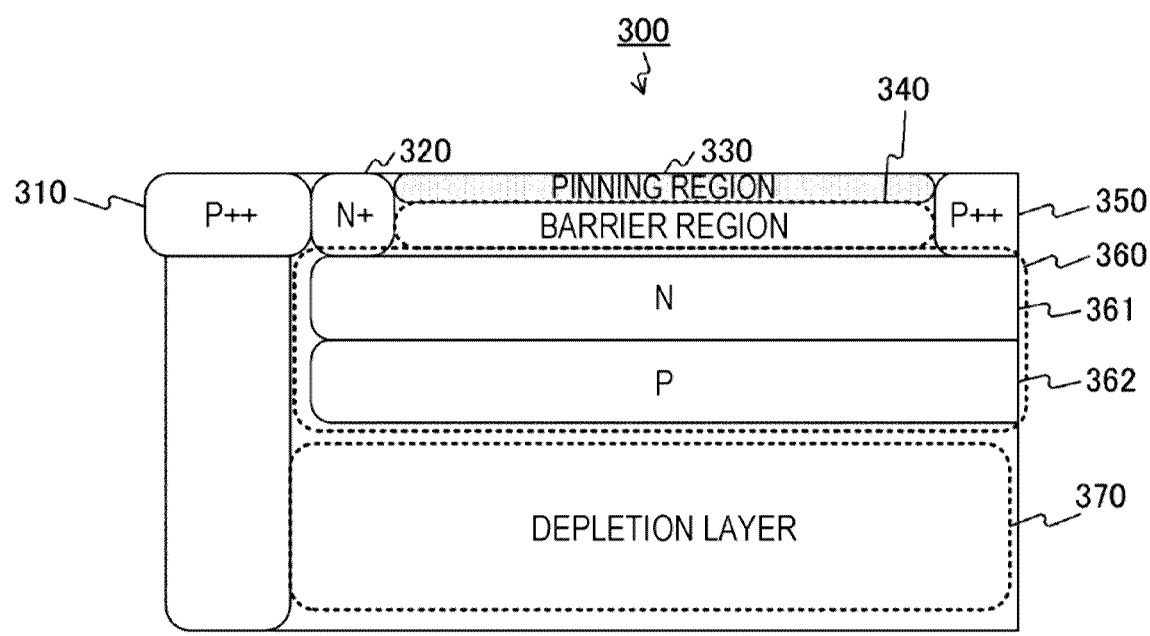

[Fig. 12]
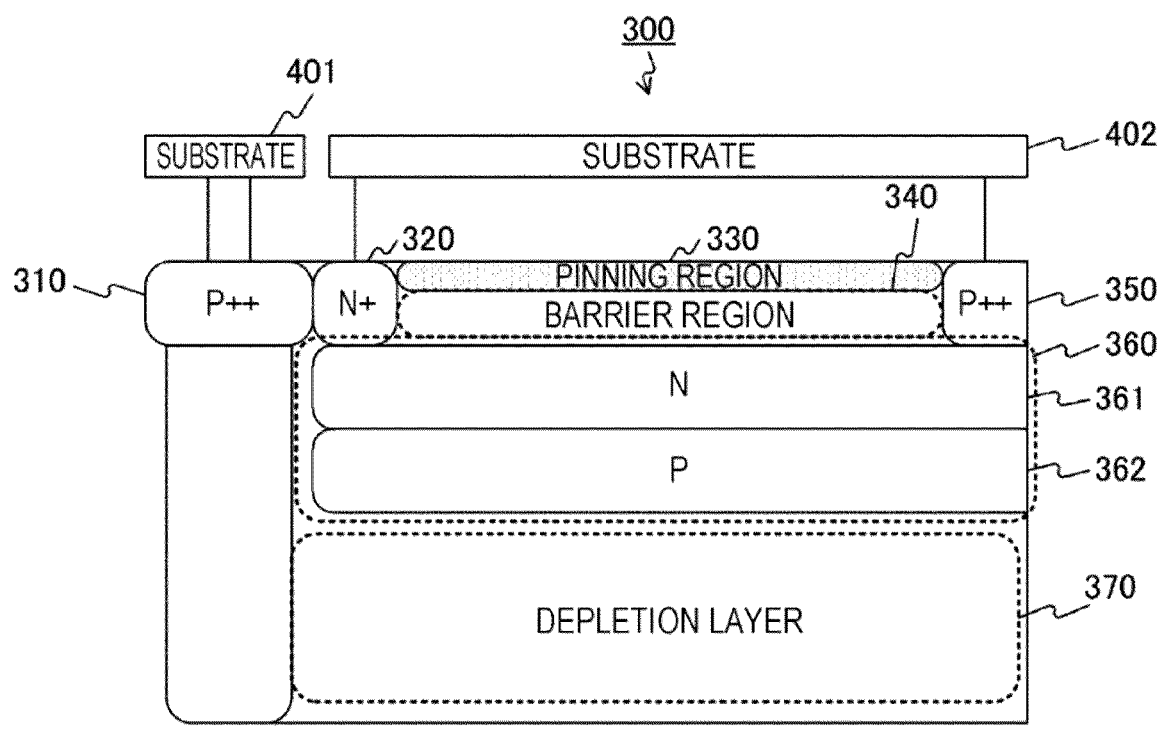

[Fig. 13]
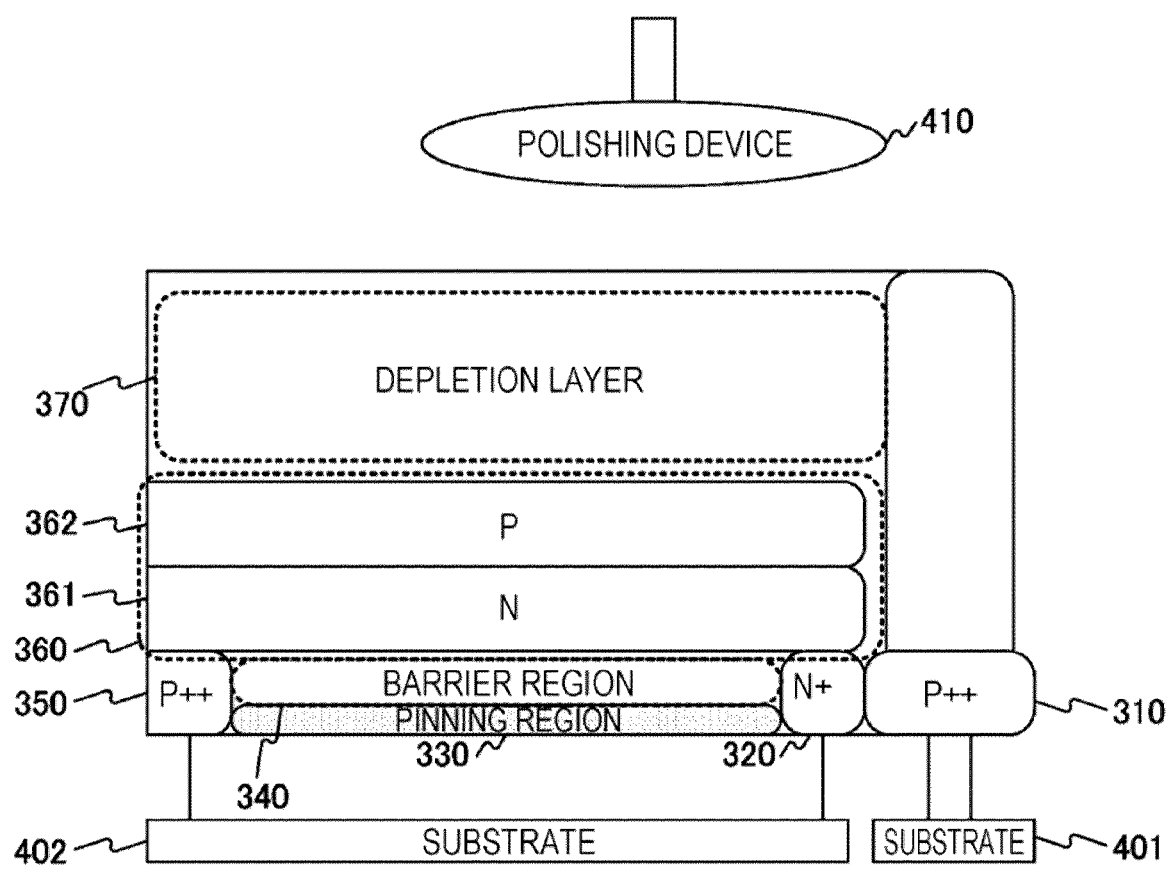

[Fig. 14]
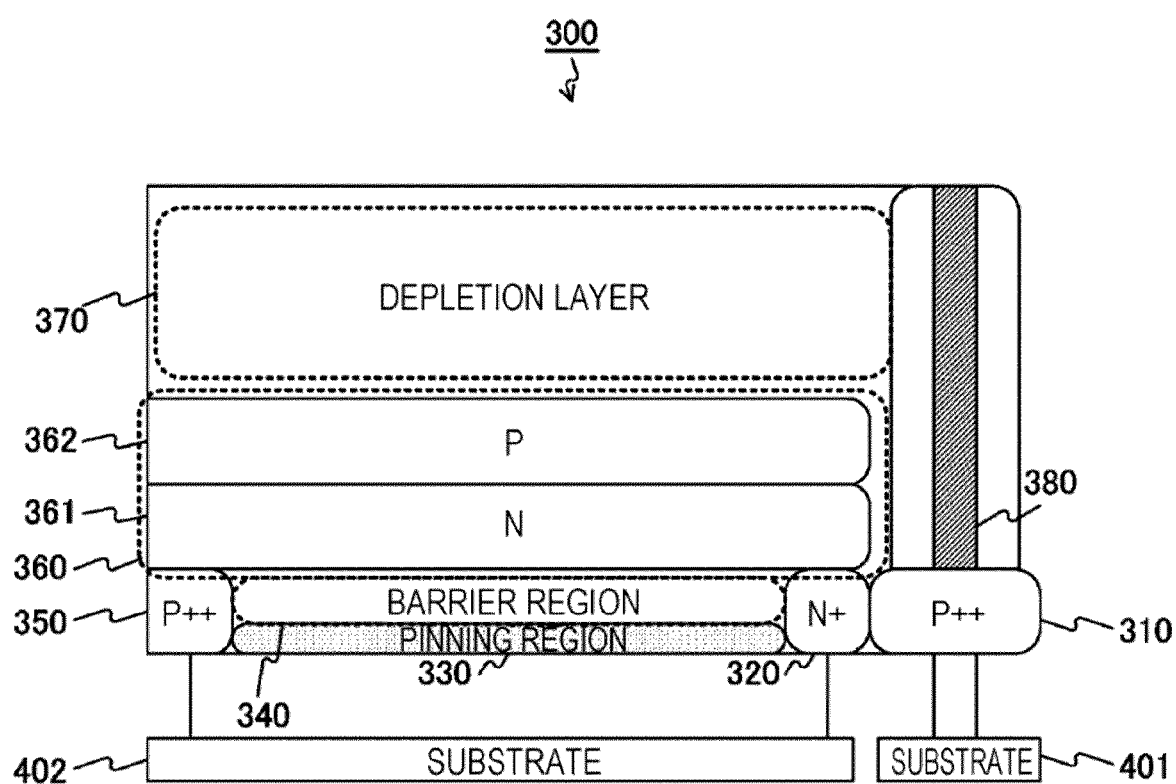

[Fig. 15]
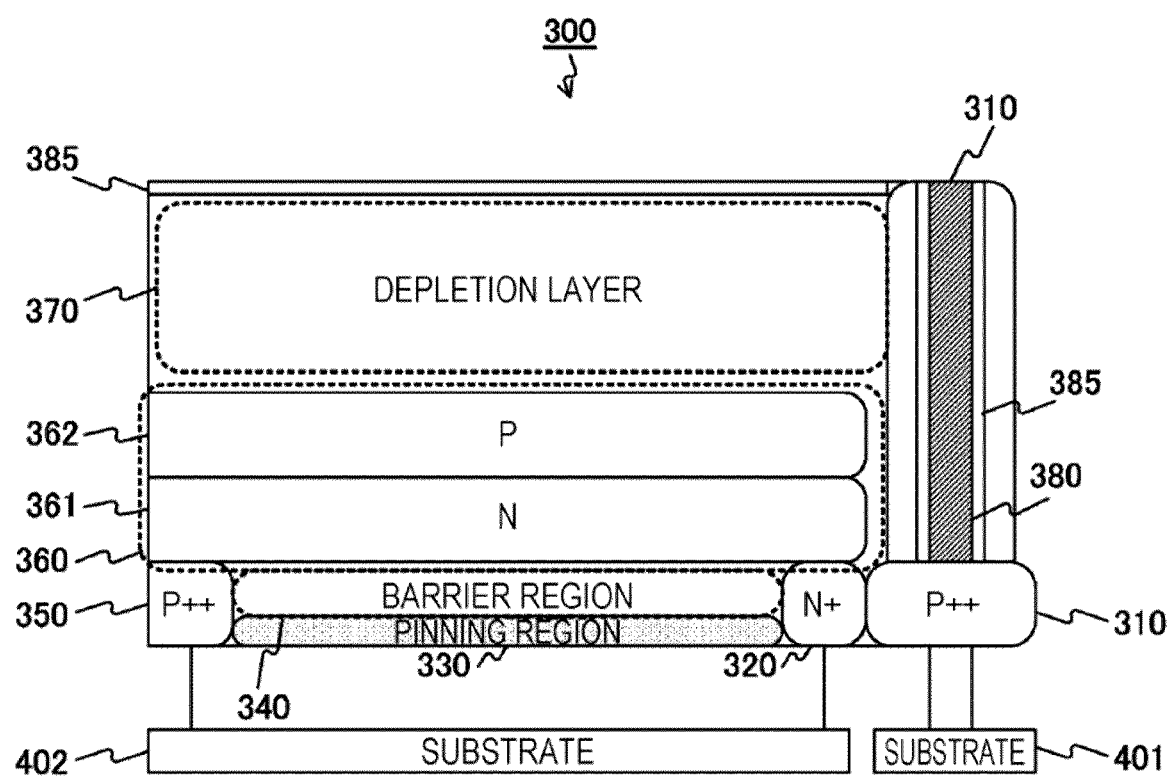

[Fig. 16]
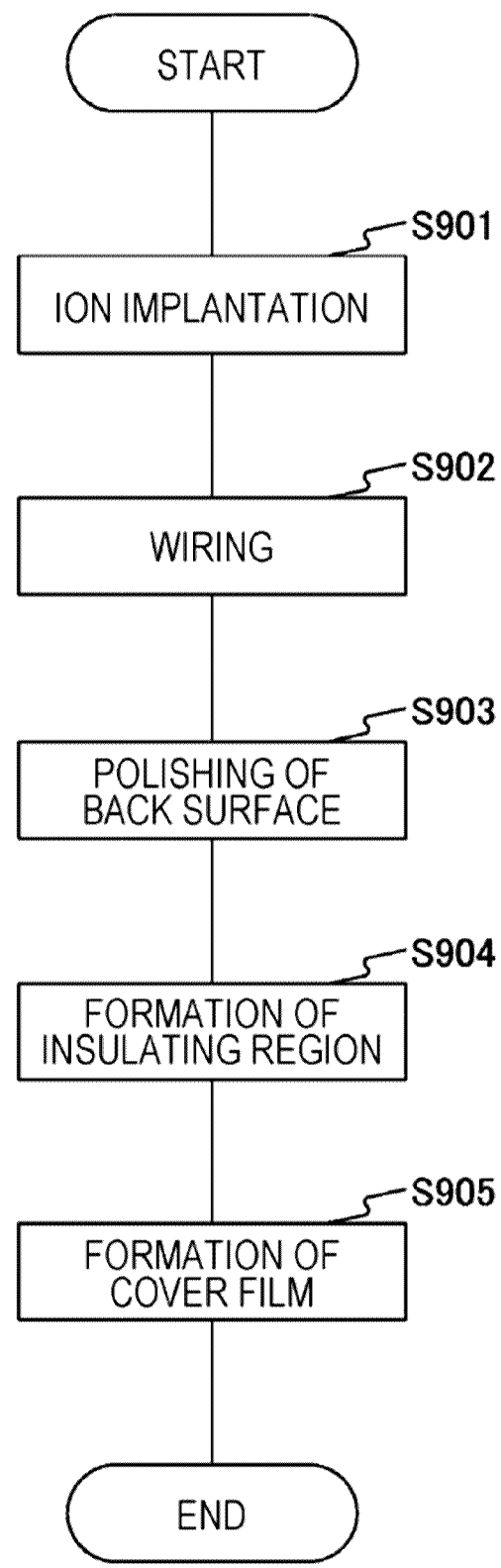

[Fig. 17]
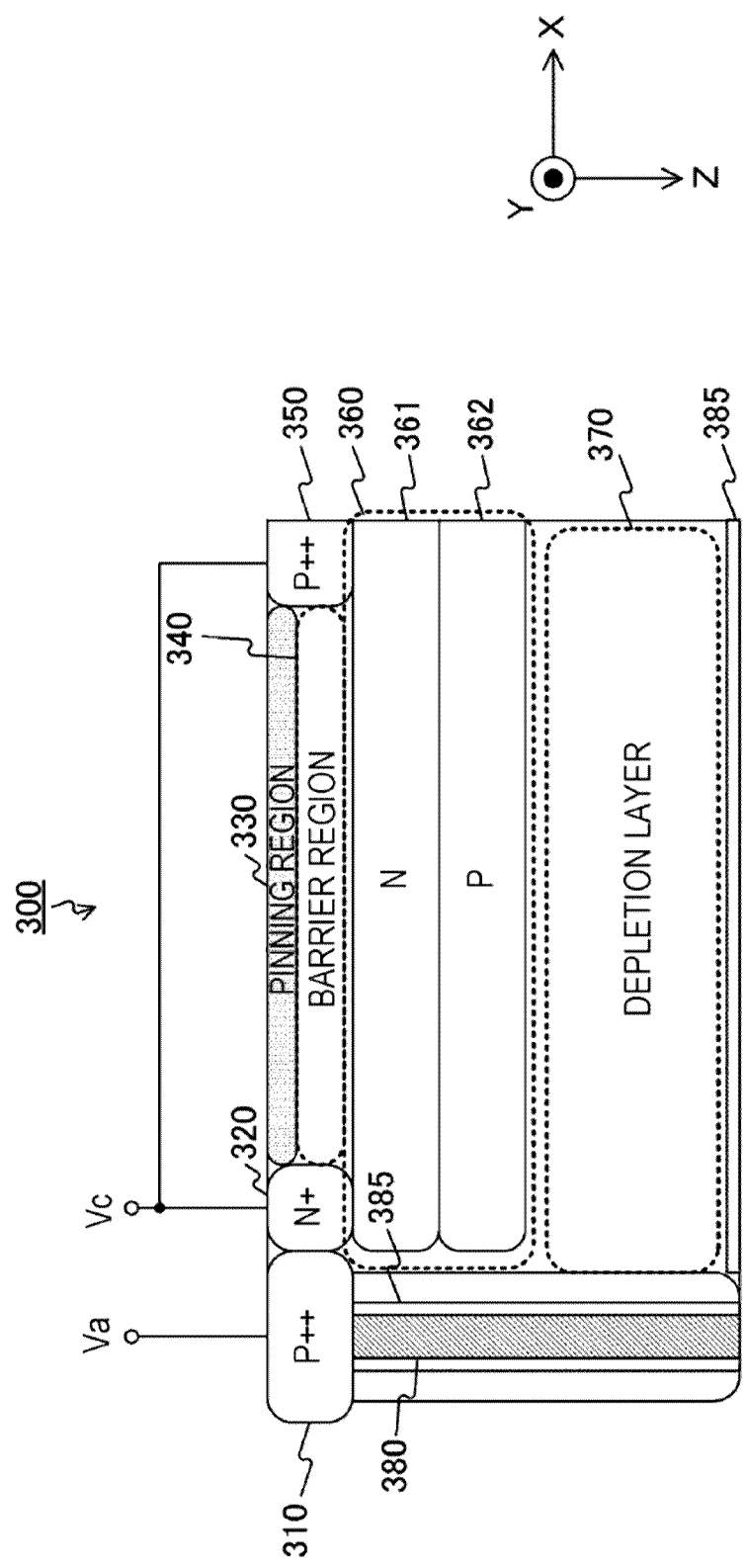

[Fig. 18]
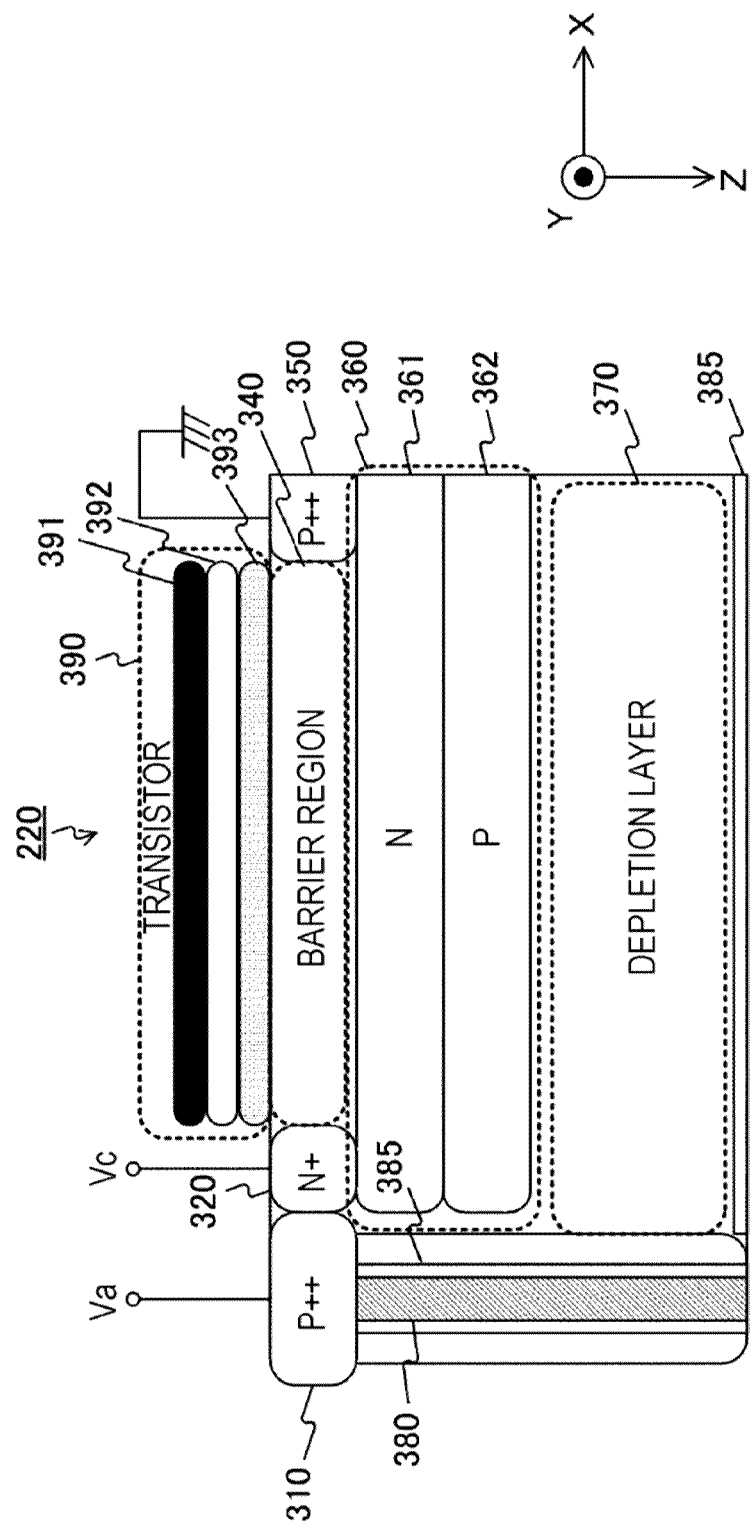

[Fig. 19]
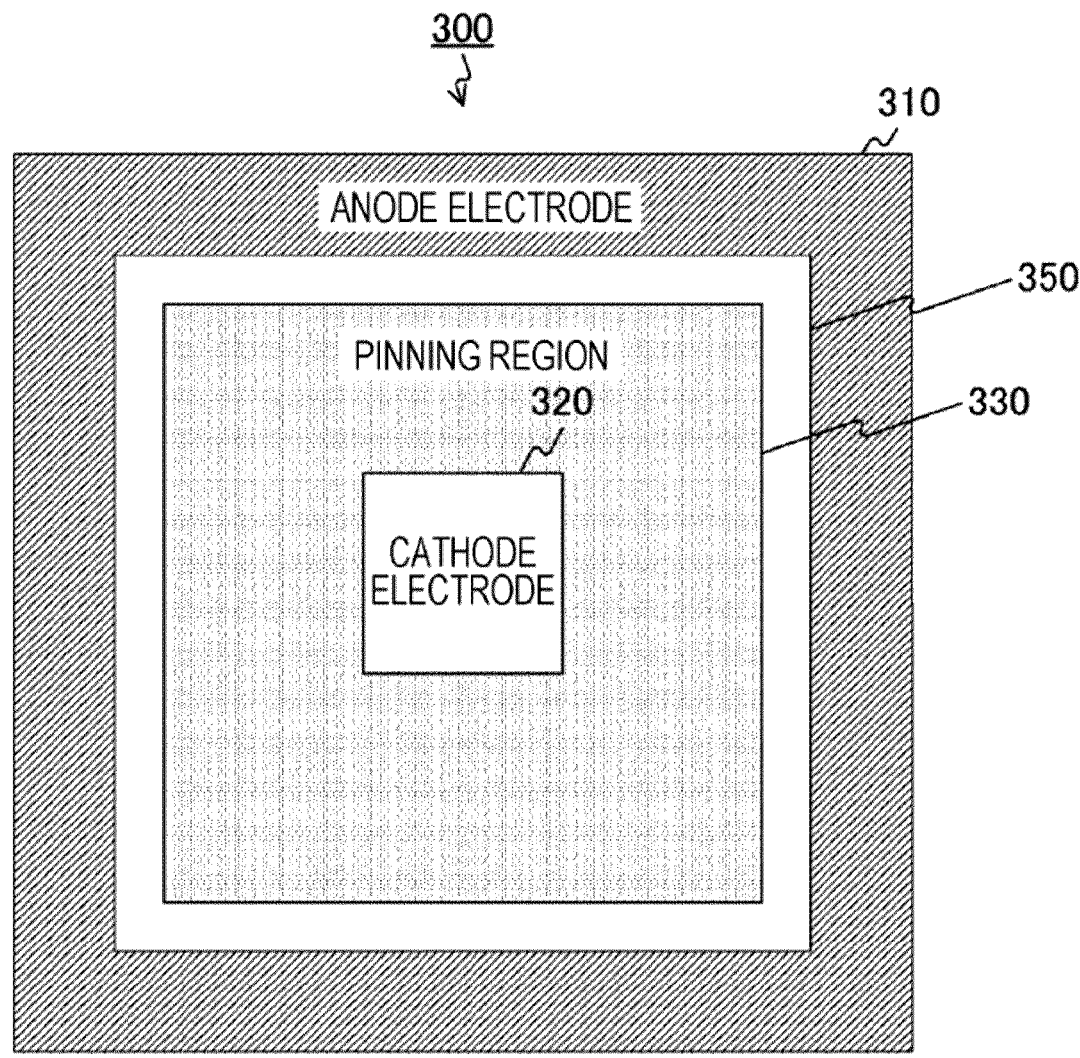

[Fig. 20]
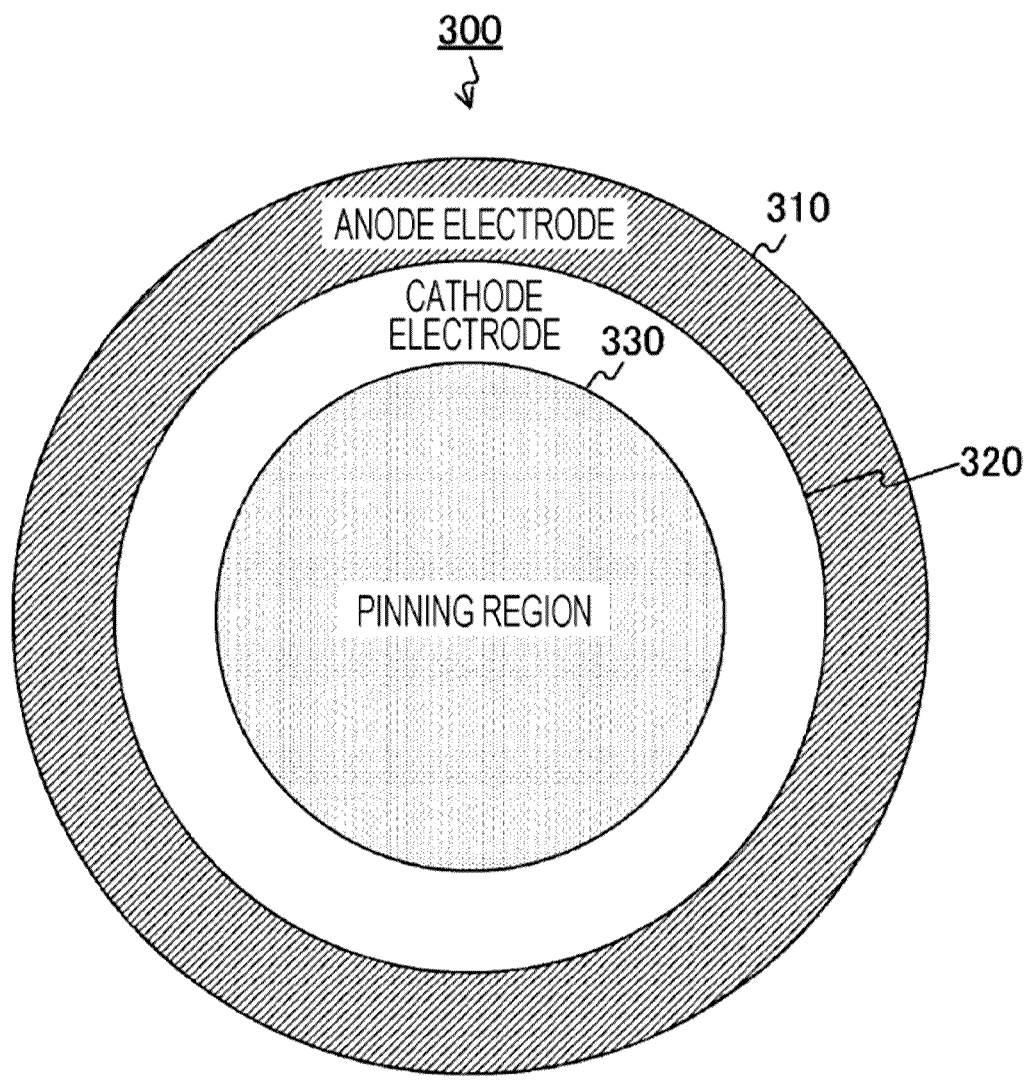

[Fig. 21]
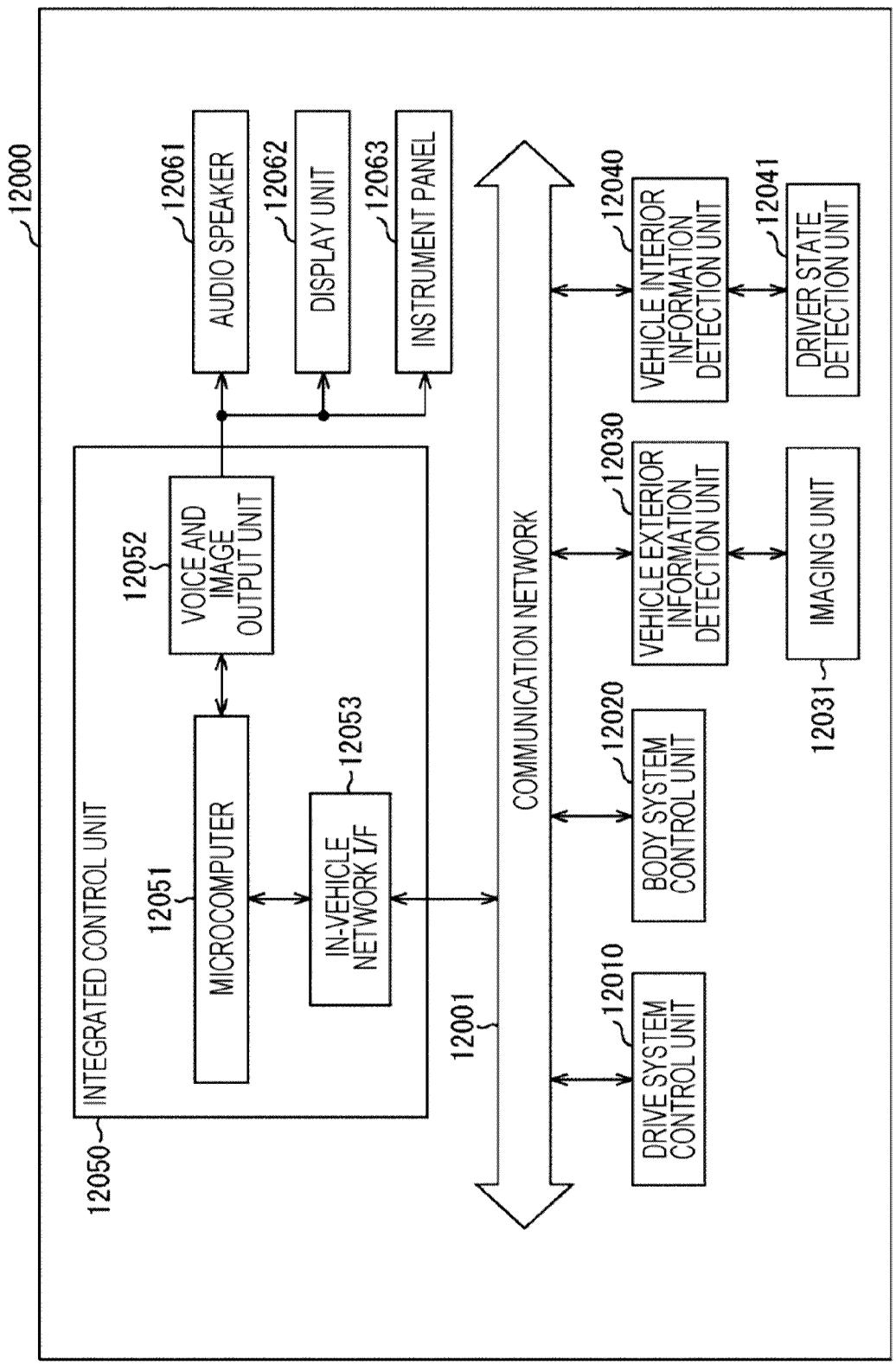

[Fig. 22]
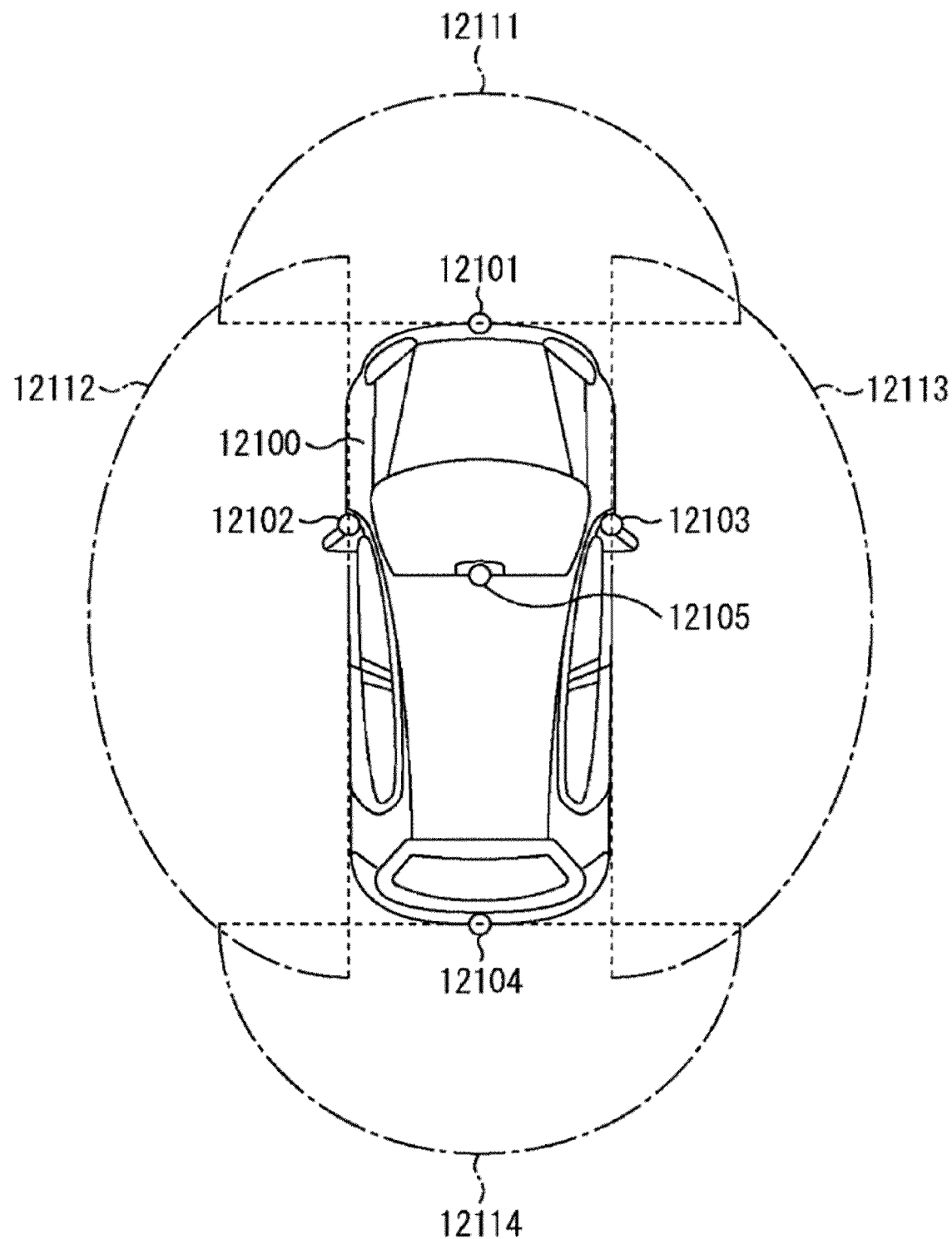

AVALANCHE PHOTODIODE SENSOR

CROSS REFERENCE TO RELATED APPLICATIONS

This application is a national stage application under 35 U.S.C. 371 and claims the benefit of PCT Application No. PCT/JP2018/032637 having an international filing date of 3 Sep. 2018, which designated the United States, which PCT application claimed the benefit of Japanese Patent Application No. 2017-206729 filed 26 Oct. 2017, the entire disclosures of each of which are incorporated herein by reference.

TECHNICAL FIELD

The present technology relates to an avalanche photodiode sensor, and particularly to, an avalanche photodiode sensor that detects weak light.

BACKGROUND ART

Recently, a device called single photon avalanche diode (SPAD), which realizes optical communication, distance measurement, photon count, and the like by capturing a very weak optical signal, has been developed and studied. The SPAD performs avalanche amplification with respect to the charge that is generated by the incident photon. Accordingly, even though light is weak, the SPAD can detect the light. However, in the SPAD, when a dark current that is generated on a silicon substrate surface is amplified, dark current characteristics such as a dark count rate (DCR) deteriorate. Here, a SPAD in which a pinning region is formed on a silicon substrate surface to suppress a dark current is suggested (for example, refer to PTL 1). The pinning region is a region in which an impurity concentration is adjusted so that a potential barrier is generated between the pinning region and an amplification region that performs avalanche amplification.

CITATION LIST

Patent Literature

PTL 1: JP 2015-041746A

SUMMARY

Technical Problem

In the related art, inflow of the dark current into the amplification region is prevented (or alternatively, reduced) due to the potential barrier between the pinning region and the amplification region, and thus it is possible to suppress deterioration of the dark current characteristics. However, the larger a potential difference between the pinning region and a cathode is, the smaller a depletion layer width between the pinning region and the cathode is. Accordingly, pixel capacity increases. Here, the pixel capacity represents electrostatic capacity of a pixel in which the SPAD is provided. When the pixel capacity increases, time necessary to take out charges collected in the pixel to perform recharge is lengthened, and thus it is difficult to improve a frame rate. When the pinning region is not provided, the pixel capacity decreases, but the dark current characteristics deteriorate. Accordingly, there is a problem that it is difficult to reduce the pixel capacity while suppressing the dark current.

The present technology has been made in consideration of the above-described situation, and it is desirable that pixel capacity is reduced while suppressing a dark current in a photodiode that performs amplification of a charge.

Solution to Problem

The present technology has been made to solve the above-described problem. According to a first aspect, an avalanche photodiode sensor includes a photoelectric conversion region disposed in a substrate and that converts incident light into electric charge; a first region of a first conductivity type on the photoelectric conversion region; a cathode disposed in the substrate adjacent to the first region and coupled to the photoelectric conversion region; an anode disposed in the substrate adjacent to the cathode; and a contact of the first conductivity type disposed in the substrate. An impurity concentration of the first region is different than an impurity concentration of the contact. For example, the impurity concentration of the first region is lower than the impurity concentration of the contact. The avalanche photodiode sensor further includes a second region of the first conductivity type disposed in the substrate and positioned between the photoelectric conversion region and the first region. The impurity concentration of the first region is higher than an impurity concentration of the second region. The avalanche photodiode sensor further includes an insulating structure formed in the substrate between the photoelectric conversion region and an adjacent photoelectric conversion region. The cathode is positioned between the anode and the first region. The avalanche photodiode sensor further includes a film on a light receiving surface of the substrate. The film is on side surfaces of the insulating structure. In a plan view, the first region surrounds the contact, and the cathode surrounds the first region. In the plan view, the anode surrounds the cathode. In the plan view, the contact is located in a central area of the first region. The contact and the cathode are coupled to a first signal line that receives a first voltage, and the anode is coupled to a second signal line that receives a second voltage. The anode, the cathode, and the first region are one of rectangular shaped or circle shaped. In the plan view, the first region surrounds the cathode, the contact surrounds the first region, and the anode surrounds the contact. The avalanche photodiode sensor further includes a transistor including a source and drain formed in the first region; an oxide layer on the first region; and a gate on the oxide layer.

According to a second aspect of the present technology, an avalanche photodiode sensor includes a photoelectric conversion region disposed in a substrate and that converts incident light into electric charge; a first region of a first conductivity type disposed in the substrate; a cathode disposed in the substrate adjacent to the first region and coupled to the photoelectric conversion region; an anode disposed in the substrate adjacent to the cathode; and a contact of the first conductivity type disposed in the first region. An impurity concentration of the first region is lower than an impurity concentration of the contact.

The avalanche photodiode sensor further includes a second region of the first conductivity type disposed in the substrate and positioned between the photoelectric conversion region and the first region.

The impurity concentration of the first region is higher than an impurity concentration of the second region.

The avalanche photodiode sensor further includes an insulating structure formed in the substrate between the photoelectric conversion region and an adjacent photoelectric conversion region.

The avalanche photodiode sensor further includes a film on a light receiving surface of the substrate, and the film is on side surfaces of the insulating structure. In a plan view, the first region surrounds the contact, and the cathode surrounds the first region.

In addition, according to a third aspect of the present technology, an avalanche photodiode sensor includes a photoelectric conversion region disposed in a substrate and that converts incident light into electric charge; a first region of a first conductivity type on the photoelectric conversion region; a first electrode disposed in the substrate adjacent to the first region and coupled to the photoelectric conversion region; a second electrode disposed in the substrate adjacent to the first electrode; and a third electrode of the first conductivity type disposed in the first region. An impurity concentration of the first region is lower than an impurity concentration of the third electrode.

Advantageous Effects of Invention

According to the present technology, it is possible to attain an excellent effect capable of reducing pixel capacity while suppressing a dark current in a photodiode that performs amplification of a charge. Furthermore, the effect stated here is not limited, and may be any one effect described in the present technology.

BRIEF DESCRIPTION OF DRAWINGS

FIG. 1 is a block diagram illustrating a configuration example of a distance measurement module according to a first embodiment of the present technology.

FIG. 2 is a block diagram illustrating a configuration example of a light-receiving unit according to a first embodiment of the present technology.

FIG. 3 is a circuit diagram illustrating a configuration example of a pixel circuit according to the first embodiment of the present technology.

FIG. 4 is an example of a cross-sectional view of a photodiode according to the first embodiment of the present technology.

FIG. 5 is an example of a plan view of the photodiode according to the first embodiment of the present technology.

FIG. 6 is an example of a potential view of the photodiode according to the first embodiment of the present technology.

FIG. 7 is an example of a potential view in a depth direction of the photodiode according to the first embodiment of the present technology.

FIG. 8 is an example of a potential view in a depth direction of a photodiode according to a comparative example.

FIG. 9 is a timing chart illustrating an example of an operation of a pixel circuit according to the first embodiment of the present technology.

FIG. 10 is a timing chart illustrating an example of an operation of a pixel circuit according to the comparative example.

FIG. 11 is an example of a cross-sectional view of the photodiode before mounting a substrate according to the first embodiment of the present technology.

FIG. 12 is an example of a cross-sectional view of the photodiode after mounting the substrate according to the first embodiment of the present technology.

FIG. 13 is an example of a cross-sectional view of the photodiode before forming an insulating region according to the first embodiment of the present technology.

FIG. 14 is an example of a cross-sectional view of the photodiode after forming the insulating region according to the first embodiment of the present technology.

FIG. 15 is an example of a cross-sectional view of the photodiode after forming a cover film according to the first embodiment of the present technology.

FIG. 16 is a flowchart illustrating an example of a method of manufacturing the photodiode according to the first embodiment of the present technology.

FIG. 17 is an example of a cross-sectional view of a photodiode according to a second embodiment of the present technology.

FIG. 18 is an example of a cross-sectional view of a pixel circuit according to a third embodiment of the present technology.

FIG. 19 is an example of a plan view of a photodiode according to a fourth embodiment of the present technology.

FIG. 20 is an example of a plan view of a photodiode according to a fifth embodiment of the present technology.

FIG. 21 is a block diagram illustrating a schematic configuration example of a vehicle control system.

FIG. 22 is a view illustrating an example of an installation position of an imaging unit.

DESCRIPTION OF EMBODIMENTS

Hereinafter, embodiments for carrying out the present technology (hereinafter, referred to as embodiments) will be described. Description will be made in the following order.

1. First Embodiment (Example in Which Impurity Concentration of Pinning Region is Set to be Lower Than That of Contact)

2. Second Embodiment (Example in Which Same Potential is Applied to Cathode Electrode and Contact)

3. Third Embodiment (Example in Which Negative Bias is Applied to Gate of Transistor)

4. Fourth Embodiment (Example in Which Impurity Concentration of Pinning Region on Outer Side of Cathode Electrode is Set to be Lower Than That of Contact)

5. Fifth Embodiment (Example in Which Impurity Concentration of Circular Pinning Region is Set to be Lower Than That of Contact)

6. Application Example to Moving Body

1. First Embodiment

"Configuration Example of Distance Measurement Module"

FIG. 1 is a block diagram illustrating a configuration example of a distance measurement module 100 according to a first embodiment of the present technology. The distance measurement module 100 measures a distance from an object by using a time of flight (ToF) method, and includes a light-emitting unit 110, a control unit 120, a light-receiving unit 200, and a distance measurement computation unit 130.

The light-emitting unit 110 emits pulse light as irradiation light in accordance with a control of the control unit 120.

The light-receiving unit 200 receives reflected light with respect to intermittent light and generates measurement data indicating turnaround time of light on the basis of a clock signal transmitted from the control unit 120, and the like. The light-receiving unit 200 supplies predetermined pieces of measurement data to the distance measurement computation unit 130 through a signal line 209.

The control unit 120 controls the light-emitting unit 110 and the light-receiving unit 200. The control unit 120 generates a timing signal indicating light-emission timing of irradiation light, and supplies the timing signal to the light-emitting unit 110 and the light-receiving unit 200 through signal lines 128 and 129.

The distance measurement computation unit 130 computes a distance up to an object on the basis of the measurement data transmitted from the light-receiving unit 200. The distance measurement computation unit 130 generates image data, in which a plurality of pieces of distance data indicating the distance that are computed are arranged in a two-dimensional lattice shape, in synchronization with a vertical synchronization signal, and outputs the image data. For example, the image data can be used in image processing in which gradation processing corresponding to a distance is performed, gesture recognition, and the like.

"Configuration Example of Light-Receiving Unit"

FIG. 2 is a block diagram illustrating a configuration example of the light-receiving unit 200 according to the first embodiment of the present technology. The light-receiving unit 200 includes a pixel array unit 210 and a read-out circuit 230. A plurality of pixel circuits 220 are arranged in the pixel array unit 210 in a two-dimensional lattice shape.

Each of the pixel circuits 220 generates a pulse signal when receiving reflected light, and output the pulse signal to the read-out circuit 230.

The read-out circuit 230 reads out the pulse signal transmitted from the pixel array unit 210. The read-out circuit 230 measures a turnaround time from light-emission timing of irradiation light to light-reception timing indicated by the pulse signal by using a time to digital converter (TDC), and the like. Then, the read-out circuit 230 supplies measurement data indicating a measurement value to the distance measurement computation unit 130. The distance measurement computation unit 130 divides a value, which is obtained by multiplying the turnaround time by the speed of light, by two to calculate a distance up to an object.

"Configuration Example of Pixel Circuit"

FIG. 3 is a circuit diagram illustrating a configuration example of a pixel circuit 220 according to the first embodiment of the present technology. The pixel circuit 220 includes a resistor 221 and a photodiode (or photoelectric conversion region) 300. Furthermore, in the same drawing, circuits and elements other than the resistor 221 and the photodiode 300 are omitted.

The resistor 221 is inserted between a power supply and a cathode of a photodiode 300. The photodiode 300 amplifies light through photoelectric conversion. For example, a SPAD can be used as the photodiode 300.

A dark-state cathodic potential of the photodiode 300 is set as Vop. When the photodiode 300 receives reflected light and performs avalanche amplification, a large current flows to the resistor 221 and voltage drop occurs. When the cathodic potential decreases to a potential Vbd at which the avalanche amplification does not occur due to the voltage drop, the large current stops. This phenomenon is referred to as "quench."

Next, charges collected in the photodiode 300 are leaked due to recharge by the potential Vop, and the cathodic potential returns to the potential Vop from the potential Vbd immediately after the quench. Due to returning to the potential Vop, the photodiode 300 can response to a photon. Here, a charge amount Q stored in the photodiode 300 is expressed by the following expression.

$$Q = C \times (Vop - Vbd).$$

In the expression, C represents electrostatic capacity (pixel capacity) of the pixel circuit 220. A unit of Q is, for example, a coulomb (C), and a unit of the pixel capacity C is, for example, a farad (F). In addition, a unit of the potential Vop and the potential Vbd is, for example, a volt (V).

Time from a point of time at which lowering a cathodic potential initiates to a point of time at which the cathodic potential returns to the potential Vop is time for which the photodiode 300 is not able to react with a photon, and is referred to as "dead time." In the dead time, time from occurrence of avalanche amplification to occurrence of quench is very short, and thus a length of the dead time is approximately limited by a recharge time of the photodiode 300. The smaller the pixel capacity C is, the shorter the recharge time becomes. Accordingly, a reduction of the pixel capacity C is demanded to realize a high frame rate (that is, a frequency of a vertical synchronization signal).

Furthermore, the pixel circuit 220 is provided in the distance measurement module 100, but the pixel circuit 220 may be provided in a circuit or a device other than the distance measurement module 100. For example, the pixel circuit 220 can be used in a circuit and the like which perform optical communication, or a circuit and the like which perform photon count.

"Configuration Example of Photodiode"

FIG. 4 is an example of a cross-sectional view of the photodiode 300 according to the first embodiment of the present technology. A direction perpendicular to a light-receiving surface of the photodiode 300 is set as a Z direction. In addition, a predetermined direction parallel to the light-receiving surface is set as an X direction. A direction perpendicular to the X direction and the Z direction is set as a Y direction.

When viewed form the Z direction, an insulating region (or insulating structure) 380 that isolates pixels is provided in the vicinity of an outer peripheral edge of the photodiode 300.

In addition, a cover film 385 is formed on the light-receiving surface and a lateral surface of the insulating region 380. The cover film 385 may include an oxide, such as zirconium oxide, hafnium oxide, and/or aluminum oxide, etc. A depletion layer 370 is formed on an upper side of the cover film 385 in a state in which the light-receiving surface is set as the lowest surface. For example, the depletion layer 370 includes an N-type semiconductor. An amplification region 360 including an N-layer 361 and a P-layer 362 is formed on an upper side of the depletion layer 370. The N-layer 361 is formed on an upper side of the P-layer 362.

In addition, in a state in which the light-receiving surface is set as a rear surface, a pinning region 330 is formed on a front surface opposite to the rear surface, and an anode electrode 310, a cathode electrode 320, and a contact 350 are buried in the pinning region 330. A predetermined reference potential (ground potential and the like) is applied to the contact 350. The anode electrode 310 and the contact 350 are formed through addition of, for example, an acceptor, and the cathode electrode 320 is formed through addition of, for example, a donor. The contact 350 may be located in a central area of the pinning region 330. Furthermore, the contact 350 is an example of a reference electrode in the appended claims.

In addition, an impurity concentration of the pinning region 330 is adjusted so that a barrier region 340 having a potential barrier is formed between the pinning region 330 and the amplification region 360 in the Z direction. Details of the impurity concentration will be described later.

The depletion layer 370 generates a charge through photoelectric conversion, and the amplification region 360 performs avalanche amplification with respect to the charge. Then, the charge that is amplified is output from the cathode electrode 320.

In addition, the impurity concentration of the pinning region 330 is set to a value different than (e.g., lower than) that of the contact 350, for example, 1 E17/cubic centimeters (/cm$^3$). In addition, the impurity concentration of the pinning region 330 is set to a value higher than that of the barrier region 340.

FIG. 5 is an example of a plan view of the photodiode 300 according to the first embodiment of the present technology. A shape of the photodiode 300 is, for example, a rectangular shape when viewed from the Z direction. The anode electrode 310 is disposed along an outer edge of the photodiode 300. The cathode electrode 320 is disposed to be adjacent to an inner side of the anode electrode 310. The pinning region 330 is provided to be adjacent to an inner side of the cathode electrode 320. The contact 350 is disposed at the inside (the center and the like) of the pinning region 330.

FIG. 6 is an example of a potential view of the photodiode 300 according to the first embodiment of the present technology. In the same drawing, the horizontal axis represents a distance from an outer edge of the photodiode 300 in the X direction, and the vertical axis represents a distance (depth) in the Z direction. In addition, in the same drawing, it is assumed that the darker a color of a region, the higher a potential of the region is. For example, a potential of the pinning region 330 is higher than that of the contact 350. The reason for this is because the impurity concentration of the pinning region 330 is lower than that of the contact 350.

FIG. 7 is an example of a potential view in a depth direction of the photodiode according to the first embodiment of the present technology. In the same drawing, the vertical axis represents a potential, and the horizontal axis represents a depth from a surface in a line segment Z1-Z2 in FIG. 6.

As described above, since the impurity concentration of the pinning region 330 is set to be lower than that of the contact 350, a potential of the pinning region 330 becomes higher than that of the contact 350, and is close to a cathodic potential. For example, a potential of the contact 350 becomes 2.7 volts (V) in comparison to a cathodic potential of 3.0 volts (V).

In addition, a potential of the barrier region 340 between the pinning region 330 and the amplification region 360 is higher than that of the pinning region 330. The cathode electrode 320 is buried in the pinning region 330, and thus there is a concern that even when light is not incident thereto, a dark current (in other words, leakage current) may occur. A hole in the leakage current migrates to a low-potential side. However, a potential barrier in the barrier region 340 occurs between the pinning region 330 and the amplification region 360, and thus the hole does not reach the amplification region 360. On the other hand, a potential barrier does not exist between the pinning region 330 and the contact 350 set to a ground potential, and the potential of the contact 350 is lower than that of the pinning region 330, and thus a hole is absorbed to a ground.

In addition, an electron in the leakage current migrates to a high-potential side. As described above, the cathodic potential is higher in comparison to the pinning region 330, and thus, the electron is output from the cathode electrode 320 and is not problematic. In addition, the potential of the amplification region 360 is lower than that of the pinning region 330, and thus an electron does not jump into the amplification region 360.

As a result, a hole that occurs as a dark current is not measured as the dark current, and it is possible to suppress deterioration of DCR.

In addition, when the impurity concentration of the pinning region 330 is set to be smaller than that of the contact 350, a difference in the impurity concentration between the pinning region 330 and the cathode electrode 320 further decreases in comparison to an opposite case. According to this, a depletion layer width between the pinning region 330 and the cathode electrode 320 becomes wider. When the depletion layer width becomes wider, the charge amount capable of being stored in the junction portion between the pinning region 330 and the cathode electrode 320 deceases, and the pixel capacity C decreases.

Here, description will be given on the assumption of a comparative example in which the impurity concentration of the pinning region 330 is set to equal to or greater than the impurity concentration of the contact 350. FIG. 8 is an example of a potential view in a depth direction of a photodiode in the comparative example.

When the impurity concentration of the pinning region 330 is set to be equal to or greater than the impurity concentration of the contact 350, a potential barrier of the barrier region 340 is enlarged, and it is easy to suppress a leakage current. However, a difference in the impurity concentration between the pinning region 330 and the cathode electrode 320 increases, and the depletion layer width therebetween becomes narrower, and thus the pixel capacity C increases.

FIG. 9 is a timing chart illustrating an example of an operation of the pixel circuit 220 according to the first embodiment of the present technology. At a timing T0, when the photodiode 300 receives reflected light and performs avalanche amplification, a large current flows to a resistor 221, and voltage drop occurs. Due to the voltage drop, when the cathodic potential is lowered to a ground potential GND (or 0 volt) at which avalanche amplification does not occur at a timing T1, the large current is stopped.

Next, charges collected in the photodiode 300 are leaked due to recharge by the potential Vop, and the cathodic potential at a timing T2 returns from the ground potential GND immediately after the quench to the potential Vop.

Time from the timing T0 at which lowering of the cathodic potential initiates to the timing T2 at which the cathodic potential returns to the potential Vop corresponds to the dead time. A length of the dead time is mostly limited by a recharge time from the timing T1 to the timing T2.

In the photodiode 300, since the impurity concentration of the pinning region 330 is set to be smaller than that of the contact 350, the pixel capacity C is reduced, and thus it is possible to shorten the recharge time. According to this, the dead time is shortened, and thus a high frame rate can be realized.

FIG. 10 is a timing chart illustrating an example of an operation of a pixel circuit according to a comparative example. In this comparative example, the impurity concentration of the pinning region 330 is set to be equal to or greater than the impurity concentration of the contact 350, and thus the pixel capacity C increases, and the recharge time is lengthened. As a result, the dead time is lengthened, and it is difficult to realize the high frame rate.

"Method of Manufacturing Photodiode"

FIG. 11 is an example of a cross-sectional view of the photodiode 300 before mounting a substrate according to the first embodiment of the present technology. Ion implantation is performed sequentially from a deeper side from the front surface. For example, through the ion implantation, the depletion layer 370 is formed, and the amplification region 360 is subsequently formed. In addition, the anode electrode 310, the cathode electrode 320, and the contact 350 are buried, and the pinning region 330 is formed. Due to formation of the pinning region 330, a potential barrier (barrier region 340) is formed between the pinning region 330 and the amplification region 360.

FIG. 12 is an example of a cross-sectional view of the photodiode 300 after mounting the substrate according to the first embodiment of the present technology. The anode electrode 310, the cathode electrode 320, and the contact 350 are connected to substrates 401 and 402 through a signal line.

FIG. 13 is an example of a cross-sectional view of the photodiode before forming an insulating region according to the first embodiment of the present technology. After connecting the substrates 401 and 402, the light-receiving surface is polished by a polishing device 410.

FIG. 14 is an example of a cross-sectional view of the photodiode after forming the insulating region according to the first embodiment of the present technology. After the polishing, the insulating region 380 is formed in the vicinity of an outer edge of the photodiode 300 and pixels are isolated.

FIG. 15 is an example of a cross-sectional view of the photodiode after forming the cover film 385 according to the first embodiment of the present technology. After forming the insulating region 380, the cover film 385 is formed on the light-receiving surface and the lateral surface of the insulating region 380.

FIG. 16 is a flowchart illustrating an example of a method of manufacturing the photodiode 300 according to the first embodiment of the present technology. The depletion layer 370 and the amplification region 360 are formed through ion implantation (step S901). Next, a signal line is wired (step S902), and the rear surface is polished (step S903). In addition, the insulating region 380 is formed (step S904), and the cover film is formed (step S905). After step S905, the remaining processes are executed, and a process of manufacturing the photodiode 300 is terminated.

As described above, in the first embodiment of the present technology, since the impurity concentration of the pinning region 330 is set to be lower than that of the contact 350, a difference in the impurity concentration between the pinning region 330 and the cathode electrode 320 is made to be small, and thus it is possible to widen the depletion layer width therebetween. According to this, it is possible to reduce electrostatic capacity of the pixel circuit 220.

2. Second Embodiment

In the above-described first embodiment, the impurity concentration of the pinning region 330 is set to be lower than that of the contact 350. However, the potential barrier further decreases in comparison to a case where the impurity concentration is set to be equal to or greater than the impurity concentration of the contact 350. Accordingly, when a dark current increases, there is a concern that a hole in the dark current jumps over the potential barrier, and jumps to the amplification region 360. A photodiode 300 according to the second embodiment is different from the first embodiment in that the pixel capacity is reduced by a method other than adjustment of the impurity concentration of the pinning region 330.

FIG. 17 is an example of a cross-sectional view of the photodiode 300 according to the second embodiment of the present technology. The photodiode 300 of the second embodiment is different from the first embodiment in that the contact 350 is connected to the cathode electrode 320 through a signal line. According to this, a cathodic potential is applied to the contact 350, and a potential difference between the contact 350 and the cathode electrode 320 does not exist. Accordingly, the pixel capacity C of the photodiode 300 is further reduced in comparison to the first embodiment from the viewpoint of a circuit connected to the photodiode 300.

In addition, when a potential difference exists between a wire between the contact 350 and the ground, and a wire connected to the cathode electrode 320, wiring capacity occurs. However, in the second embodiment, the potential difference does not exist between the wires, and thus the wiring capacity does not occur. Accordingly, it is possible to further reduce the pixel capacity C to a certain extent corresponding to the non-occurrence of the wiring capacity.

In addition, the impurity concentration of the pinning region 330 of the second embodiment may be set to be smaller or equal to or greater than that of the contact 350. Furthermore, a method of manufacturing the photodiode 300 of the second embodiment is the same as in the first embodiment except that the contact 350 and the cathode electrode 320 are connected to each other.

Furthermore, the cathode electrode 320 and the contact 350 are an example of a pair of electrodes described in the appended claims.

As described above, in the second embodiment of the present technology, the same potential is applied to the cathode electrode 320 and the contact 350, and thus it is possible to further reduce the pixel capacity in comparison to a case where potentials different from each are applied thereto.

3. Third Embodiment

In the above-described first embodiment, the pinning region 330 is formed in the photodiode 300 through ion implantation. However, there is a concern that a defect damage may occur on a substrate the photodiode 300 is formed due to the ion implantation. A third embodiment is different from the first embodiment in that a semiconductor layer of a metal oxide semiconductor (MOS) transistor adjacent to the photodiode 300 is used as the pinning region.

FIG. 18 is an example of a cross-sectional view of a pixel circuit 220 according to the third embodiment of the present technology. The pixel circuit 220 of the third embodiment further includes a transistor 390. In addition, the pinning region 330 is not formed in the photodiode 300.

The transistor 390 is a MOS transistor including a metal layer 391, an oxide film 392, and a semiconductor layer 393. The semiconductor layer 393 is provided on an upper side of the barrier region 340 of the photodiode 300, and the oxide film 392 is formed on an upper side of the semiconductor layer 393. In addition, the metal layer 391 is provided on an upper side of the oxide film 392.

The metal layer 391 can be used as a gate of the transistor 390, and a source and a drain are formed in the semiconductor layer 393.

A negative bias lower than a reference potential (ground potential and the like) is applied to the gate of the transistor 390. According to this, it is possible to suppress a dark current by inducing a hole in the dark current. That is, the semiconductor layer 393 functions as a pinning region.

On the other hand, impurities for pinning may not be added to a silicon surface of the photodiode 300, and thus it is possible to remove a defect damage due to addition of the impurities. In addition, in a case where the oxide film 392 has a high quality, an interface level is lowered, and thus it is possible to lower the DCR. According to this, it is possible to raise a potential of the pinning region (semiconductor layer 393) to a certain extent corresponding to lowering of the DCR due to lowering of the interface level. As a result, it is possible to further reduce the pixel capacity C in comparison to the first embodiment.

As described above, according to the third embodiment of the present technology, since the dark current is suppressed by applying a negative bias to the gate electrode of the transistor 390, it is not necessary to form the pinning region in the photodiode 300. According to this, it is possible to remove the defect damage of the photodiode 300 due to formation of the pinning region.

4. Fourth Embodiment

In the above-described first embodiment, the cathode electrode 320 is formed at the periphery of the pinning region 330. However, the further a pixel size increases, the longer a junction portion between the cathode electrode 320 and the pinning region 330 becomes. Accordingly, the pixel capacity increases. Here, the length of the junction portion represents a length in a direction parallel to a boundary line between the cathode electrode 320 and the pinning region 330. The photodiode 300 of the fourth embodiment is different from the first embodiment in that the pixel capacity is reduced by disposing the cathode electrode 320 on an inner side of the pinning region 330.

FIG. 19 is an example of a plan view of the photodiode 300 according to the fourth embodiment of the present technology. In the photodiode 300 of the fourth embodiment, the cathode electrode 320 is disposed on an inner side (the center and the like) of the pinning region 330 when viewed from the Z direction. In addition, the contact 350 is disposed at the periphery of the pinning region 330. When the cathode electrode 320 is disposed on an inner side of the pinning region 330, a junction portion between the cathode electrode 320 and the pinning region 330 becomes shorter in comparison to the first embodiment, and thus the pixel capacity is reduced.

As described above, in the fourth embodiment of the present technology, since the cathode electrode 320 is disposed on an inner side of the pinning region 330, it is possible to further shorten the junction portion in comparison to a case where the cathode electrode 320 is disposed at the periphery of the pinning region 330. According to this, it is possible to reduce the electrostatic capacity of the pixel circuit 220.

5. Fifth Embodiment

In the above-described first embodiment, the shape of the photodiode 300 is set to a rectangular shape. However, in a case of the rectangular shape, an intense electric field is likely to occur at an end of the photodiode 300, and thus avalanche amplification occurs at the outside of the amplification region 360, and thus there is a concern that an operation of the pixel circuit 220 is blocked. This phenomenon is referred to as an edge breakdown phenomenon. The fifth embodiment is different from the first embodiment in that the shape of the photodiode 300 is set to a circular shape.

FIG. 20 is an example of a plan view of the photodiode 300 according to the fifth embodiment of the present technology. The photodiode 300 of the fifth embodiment is different from the first embodiment in that a shape on a plane parallel to the light-receiving surface is set to a circular shape. Shapes of the cathode electrode 320, the pinning region 330, and the contact 350 in the photodiode 300 are also set to a circular shape.

When the shape of the photodiode 300 is set to a circular shape, an effective area of the amplification region 360 decreases, and thus there is a possibility that an occurrence probability (photon detection efficiency (PDE)) of avalanche amplification with respect to one photon decreases. However, an intense electric field is less likely to occur at an end of the photodiode 300, and thus it is possible to suppress the edge breakdown phenomenon. In addition, it is possible to enhance long-term reliability.

Furthermore, the shape of the photodiode 300 is set to the circular shape, but a polygonal shape such as a pentagon and a hexagon close to a circle may be employed.

As described above, in the fifth embodiment of the present technology, the shape of the photodiode 300 is set to a circular shape, and thus an edge disappears. As a result, it is possible to suppress the edge breakdown phenomenon.

6. Application Example to Moving Body

The technology (the present technology) according to the present disclosure is applicable to various products. For example, the technology according to the present disclosure can be realized as a device that is mounted on a moving body any one kind among an automobile, an electric vehicle, a hybrid electric vehicle, a motorcycle, a bicycle, a personal mobility, an airplane, a drone, a ship, a robot, and the like.

FIG. 21 is a block diagram illustrating a schematic configuration example of a vehicle control system that is an example of a moving body control system to which the technology according to the present disclosure is applicable.

A vehicle control system 12000 includes a plurality of electronic control units which are connected to each other through a communication network 12001. In the example illustrated in FIG. 21, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a voice and image output unit 12052, and an in-vehicle network interface (I/F) 12053 are illustrated in the drawing.

The drive system control unit 12010 controls an operation of a device relating to the drive system of the vehicle in accordance with various programs. For example, the drive system control unit 12010 functions as a control device of a drive force generation device such as an internal combustion engine and a drive motor which generate a drive force of the vehicle, a drive force transmission mechanism that transmits the drive force to wheels, a steering mechanism that adjusts a steering angle of the vehicle, and a braking device that generates a braking force of the vehicle, and the like.

The body system control unit 12020 controls an operation of various devices which are mounted to a vehicle body in accordance with various programs. For example, the body system control unit 12020 functions as a control device of a keyless entry system, a smart key system, a power window device, and various lamps such as a head lamp, a back lamp, a brake lamp, a winker, and a fog lamp. In this case, an electric wave that is transmitted from a portable device that substitutes for a key, or signals of various switches can be input to the body system control unit 12020. The body system control unit 12020 receives input of the electric wave or the signals, and controls a door lock device, a power window device, a lamp, and the like of the vehicle.

The vehicle exterior information detection unit 12030 detects information on an outer side of the vehicle on which the vehicle control system 12000 is mounted. For example, an imaging unit 12031 is connected to the vehicle exterior information detection unit 12030. The vehicle exterior information detection unit 12030 allows the imaging unit 12031 to capture a vehicle exterior image, and receives the captured image. The vehicle exterior information detection unit 12030 may perform object detection processing of a person, a vehicle, an obstacle, a sign, a character on a road, or the like, or distance detection processing on the basis of the image that is received.

The imaging unit 12031 is an optical sensor that receives light and outputs an electric signal corresponding to the amount of light received. The imaging unit 12031 can output the electric signal as an image or as distance measurement information. In addition, light received by the imaging unit 12031 may be visible light, or invisible light such as infrared rays.

The vehicle interior information detection unit 12040 detects vehicle interior information. For example, a driver state detection unit 12041 that detects a driver state is connected to the vehicle interior information detection unit 12040. For example, the driver state detection unit 12041 includes a camera that images a driver, and the vehicle interior information detection unit 12040 may calculate the degree of fatigue or the degree of concentration of a driver, or may determine whether or not the driver drowses on the basis of detection information that is input from the driver state detection unit 12041.

The microcomputer 12051 calculates a control target value of the drive force generation device, the steering mechanism, or the braking device on the basis of vehicle interior or exterior information that is acquired by the vehicle exterior information detection unit 12030 or the vehicle interior information detection unit 12040, and can output a control command to the drive system control unit 12010. For example, the microcomputer 12051 can perform a cooperative control to realize a function of an advanced driver assistance system (ADAS) which includes collision avoidance or impact mitigation of the vehicle, following travel based on an intervehicle distance, vehicle speed maintenance travel, vehicle collision alarm, vehicle lane deviation alarm, and the like.

In addition, the microcomputer 12051 can perform a cooperative control for automatic driving and the like in which the vehicle autonomously travels without depending on an operation of a driver by controlling the drive force generation device, the steering mechanism, the braking device, and the like on the basis of information in the vicinity of the vehicle which is acquired by the vehicle exterior information detection unit 12030 or the vehicle interior information detection unit 12040.

In addition, the microcomputer 12051 can output a control command to the body system control unit 12020 on the basis of the vehicle exterior information acquired by the vehicle exterior information detection unit 12030. For example, the microcomputer 12051 can perform a cooperative control to realize glare protection such as switching of a high beam into a low beam by controlling the head lamp in correspondence with a position of a preceding vehicle or an oncoming vehicle which is detected by the vehicle exterior information detection unit 12030.

The voice and image output unit 12052 transmits at least one output signal between a voice and an image to an output device capable of visually or aurally notifying a passenger in a vehicle or an outer side of the vehicle of information. In the example in FIG. 21, as the output device, an audio speaker 12061, a display unit 12062, and an instrument panel 12063 are exemplified. For example, the display unit 12062 may include at least one of an on-board display and a head-up display.

FIG. 22 is a view illustrating an example of an installation position of the imaging unit 12031.

In FIG. 22, as the imaging unit 12031, imaging units 12101, 12102, 12103, 12104, and 12105 are provided.

For example, the imaging units 12101, 12102, 12103, 12104, and 12105 are installed at positions such as a front nose, a side-view mirror, a rear bumper, a back door, an upper side of a vehicle front glass in a vehicle room, of the vehicle 12100. The imaging unit 12101 provided at the front nose, and the imaging unit 12105 that is provided on an upper side of the vehicle front glass in a vehicle room mainly acquire images on a forward side of the vehicle 12100. The imaging units 12102 and 12103 which are provided in the side-view minor mainly acquire images on a lateral side of the vehicle 12100. The imaging unit 12104 that is provided in the rear bumper or the back door mainly acquires images on a backward side of the vehicle 12100. The imaging unit 12105 that is provided on an upper side of the vehicle front glass in the vehicle room can be mainly used to detect a preceding vehicle, a pedestrian, an obstacle, a traffic signal, a traffic sign, a vehicle lane, and the like.

Furthermore, FIG. 22 illustrates an example of a photographing range of the imaging units 12101 to 12104. An image capturing range 12111 represents an image capturing range of the imaging unit 12101 that is provided in the front nose, image capturing ranges 12112 and 12113 respectively represent image capturing ranges of the imaging units 12102 and 12103 which are provided in the side-view minors, an image capturing range 12114 represents an image capturing range of the imaging unit 12104 that is provided in the rear bumper or the back door. For example, when a plurality of pieces of image data captured by the imaging unit 12101 to 12104 are superimposed on each other, it is possible to obtain an overlooking image when the vehicle 12100 is viewed from an upper side.

At least one of the imaging units 12101 to 12104 may have a function of acquiring distance information. For example, at least one of the imaging units 12101 to 12104 may be a stereo camera including a plurality of imaging elements, or may be an imaging element that includes pixels for phase difference detection.

For example, the microcomputer 12051 can extract a three-dimensional object, which is a closest three-dimensional object, particularly, on a proceeding path of the vehicle 12100 and travels in approximately the same direction as that of the vehicle 12100 that travels at a predetermined velocity (for example, 0 km/h or greater), as a preceding vehicle by obtaining distances to respective three-dimensional objects in the image capturing ranges 12111 to 12114 and a variation of the distances with the passage of time (relative velocity to the vehicle 12100) on the basis of the distance information obtained from the imaging units 12101 to 12104. In addition, the microcomputer 12051 can set a distance between vehicles to be secured in advance in front of the preceding vehicle to perform automatic brake control (also including a following stop control), an automatic acceleration control (also including a following acceleration control), and the like. As described above, it is possible to perform a cooperative control for automatic driving in which a vehicle autonomously travels without depending on an operation by a driver, and the like.

For example, the microcomputer 12051 can extract three-dimensional object data relating to a three-dimensional object by classifying a plurality of pieces of the three-dimensional object data into data of a two-wheel vehicle, data of typical vehicle, data of a large-sized vehicle, data of pedestrian, and data of other three-dimensional objects such as an electric pole on the basis of the distance information obtained from the imaging units 12101 to 12104, and can use the three-dimensional object data for automatic obstacle avoidance. For example, the microcomputer 12051 discriminates obstacles at the periphery of the vehicle 12100 into an obstacle that is visually recognized by a driver of the vehicle 12100 and an obstacle that is difficult to be visually recognized by the driver. In addition, the microcomputer 12051 determines collision risk indicating the degree of danger of collision with each of the obstacles. In a situation in which the collision risk is equal to or greater than a set value, and collision may occur, the microcomputer 12051 can assist driving for collision avoidance by outputting an alarm to the driver through the audio speaker 12061 or the display unit 12062, or by performing compulsory deceleration or avoidance steering through the drive system control unit 12010.

At least one of the imaging units 12101 to 12104 may be an infrared camera that detects infrared rays. For example, the microcomputer 12051 can recognize a pedestrian by determining whether or not the pedestrian exists in image captured by the imaging units 12101 to 12104. For example, the pedestrian recognition is performed by a procedure of extracting a specific point in images captured by the imaging units 12101 to 12104 as an infrared camera, and a procedure of performing pattern matching processing for a series of specific points indicating a contour line of an object to determine whether or not the object is a pedestrian. When the micro-computer 12051 determines that a pedestrian exists on the images captured by the imaging units 12101 to 12104, and recognizes the pedestrian, the voice and image output unit 12052 controls the display unit 12062 to overlap and display a quadrangular contour line for emphasis on the pedestrian who is recognized. In addition, the voice and image output unit 12052 may control the display unit 12062 to display an icon and the like indicating the pedestrian at a desired position.

Hereinbefore, description has been given of an example of the vehicle control system to which the present technology relating to the present disclosure is applicable. The technology relating to the present disclosure is applicable to, for example, the vehicle exterior information detection unit 12030 among the above-described configurations. Specifically, the distance measurement module 100 in FIG. 1 is applicable to the vehicle exterior information detection unit 12030 in FIG. 21. When the technology relating to the present disclosure is applied to the vehicle exterior information detection unit 12030, a dark current is suppressed, and thus accurate distance data can be obtained. Accordingly, it is possible to improve reliability of a vehicle control system.

Furthermore, the above-described embodiments illustrate an example for embodiment of the present technology, and matters in the embodiments and invention-specific matters in the appended claims have a corresponding relationship. Similarly, the invention-specific matters in the appended claims and matters in the embodiment of the present technology to which the same term is given have a corresponding relationship. However, the present technology is not limited to the embodiments and can be embodied by making various modifications in the embodiments in a range not departing from the gist. For example, to the extent that the figures show different embodiments of inventive concepts, it should be understood that the different embodiments may be combined if desired and without departing from the scope of inventive concepts.

Furthermore, the effects described in this specification are illustrative only and are not limited thereto, and other effects may exist.

It should be understood by those skilled in the art that various modifications, combinations, sub-combinations and alterations may occur depending on design requirements and other factors insofar as they are within the scope of the appended claims or the equivalents thereof.

Furthermore, the present technology can have the following configurations.

(1) A photodiode including:
an amplification region that amplifies a photoelectrically converted charge;
a cathode electrode from which the amplified charge is output;
a reference electrode to which a predetermined reference potential is applied;
a pinning region in which the cathode electrode and the reference electrode are buried and of which an impurity concentration is lower than an impurity concentration of the reference electrode; and
a barrier region which is disposed between the pinning region and the amplification region and of which an impurity concentration is lower than the impurity concentration of the pinning region.

(2) The photodiode according to (1),
in which the cathode electrode is formed at the periphery of the pinning region on a predetermined plane parallel to a light-receiving surface.

(3) The photodiode according to one or more of (1) to (2),
in which the cathode electrode is formed on an inner side of the pinning region on a predetermined plane parallel to a light-receiving surface.

(4) The photodiode according to one or more of (1) to (3),
in which a shape of the cathode electrode, the reference electrode, and the pinning region is a rectangular shape on a predetermined plane parallel to a light-receiving surface.

(5) The photodiode according to one or more of (1) to (4),
in which a shape of the cathode electrode, the reference electrode, and the pinning region is any one of a circular shape and a polygonal shape on a predetermined plane parallel to a light-receiving surface.

(6) A photodiode including:
an amplification region that amplifies a photoelectrically converted charge;
a pair of electrodes from which the amplified charge is output and which has the same potential;
a pinning region in which the pair of electrodes is buried; and
a barrier region which is disposed between the pinning region and the amplification region, and of which an impurity concentration is lower than an impurity concentration of the pinning region.

(7) A pixel circuit including:
an amplification region that amplifies a photoelectrically converted charge;

a cathode electrode from which the amplified charge is output;

a reference electrode to which a predetermined reference potential is applied;

a transistor in which a negative bias lower than the predetermined reference potential is applied to a gate; and a barrier region that is disposed between the transistor and the amplification region.

(8) A method of manufacturing a photodiode, the method including:

an amplification region procedure of forming an amplification region that amplifies a photoelectrically converted charge;

a pinning region forming procedure of forming a pinning region of which an impurity concentration is lower than an impurity concentration of a reference electrode to which a predetermined reference potential is applied; and an electrode forming procedure of burying the reference electrode and a cathode electrode from which the amplified charge is output in the pinning region.

(9) A method of manufacturing a photodiode, the method including:

an amplification region procedure of forming an amplification region that amplifies a photoelectrically converted charge;

a pinning region forming procedure of forming a pinning region; and an electrode forming procedure of burying a pair of electrodes, from which the amplified charge is output and which has the same potential, in the pinning region.

(10) An avalanche photodiode sensor, comprising:

a photoelectric conversion region disposed in a substrate and that converts incident light into electric charge;

a first region of a first conductivity type on the photoelectric conversion region;

a cathode disposed in the substrate adjacent to the first region and coupled to the photoelectric conversion region;

an anode disposed in the substrate adjacent to the cathode; and a contact of the first conductivity type disposed in the substrate, an impurity concentration of the first region being different than an impurity concentration of the contact.

(11) The avalanche photodiode sensor of (10), wherein the impurity concentration of the first region is lower than the impurity concentration of the contact.

(12) The avalanche photodiode sensor of one or more of (10) to (11) further comprising:

a second region of the first conductivity type disposed in the substrate and positioned between the photoelectric conversion region and the first region, wherein the impurity concentration of the first region is higher than an impurity concentration of the second region.

(13) The avalanche photodiode sensor of one or more of (10) to (12), further comprising:

an insulating structure formed in the substrate between the photoelectric conversion region and an adjacent photoelectric conversion region.

(14) The avalanche photodiode sensor of one or more of (10) to (13), wherein the cathode is positioned between the anode and the first region.

(15) The avalanche photodiode sensor of one or more of (10) to (14), further comprising:

a film on a light receiving surface of the substrate, wherein the film is on side surfaces of the insulating structure.

(16) The avalanche photodiode sensor of one or more of (10) to (15), wherein, in a plan view, the first region surrounds the contact, and the cathode surrounds the first region.

(17) The avalanche photodiode sensor of one or more of (10) to (16), wherein, in the plan view, the anode surrounds the cathode.

(18) The avalanche photodiode sensor of one or more of (10) to (17), wherein, in the plan view, the contact is located in a central area of the first region.

(19) The avalanche photodiode sensor of one or more of (10) to (18), wherein the contact and the cathode are coupled to a first signal line that receives a first voltage, and wherein the anode is coupled to a second signal line that receives a second voltage.

(20) The avalanche photodiode sensor of one or more of (10) to (19), wherein the anode, the cathode, and the first region are one of rectangular shaped or circle shaped.

(21) The avalanche photodiode sensor of one or more of (10) to (20), wherein, in a plan view, the first region surrounds the cathode, the contact surrounds the first region, and the anode surrounds the contact.

(22) The avalanche photodiode sensor of one or more of (10) to (21), further comprising:

a transistor including:

a source and drain formed in the first region;

an oxide layer on the first region; and a gate on the oxide layer.

(23) An avalanche photodiode sensor, comprising:

a photoelectric conversion region disposed in a substrate and that converts incident light into electric charge;

a first region of a first conductivity type disposed in the substrate;

a cathode disposed in the substrate adjacent to the first region and coupled to the photoelectric conversion region;

an anode disposed in the substrate adjacent to the cathode; and a contact of the first conductivity type disposed in the first region, an impurity concentration of the first region being lower than an impurity concentration of the contact.

(24) The avalanche photodiode sensor of (23), further comprising:

a second region of the first conductivity type disposed in the substrate and positioned between the photoelectric conversion region and the first region.

(25) The avalanche photodiode sensor of one or more of (23) to (24), wherein the impurity concentration of the first region is higher than an impurity concentration of the second region.

(26) The avalanche photodiode sensor of one or more of (23) to (25), further comprising:

an insulating structure formed in the substrate between the photoelectric conversion region and an adjacent photoelectric conversion region.

(27) The avalanche photodiode sensor of one or more of (23) to (26), further comprising:

a film on a light receiving surface of the substrate, wherein the film is on side surfaces of the insulating structure.

(28) The avalanche photodiode sensor of one or more of (23) to (27), wherein, in a plan view, the first region surrounds the contact, and the cathode surrounds the first region.

(29) An avalanche photodiode sensor, comprising:
a photoelectric conversion region disposed in a substrate and that converts incident light into electric charge;
a first region of a first conductivity type on the photoelectric conversion region;
a first electrode disposed in the substrate adjacent to the first region and coupled to the photoelectric conversion region;
a second electrode disposed in the substrate adjacent to the first electrode; and
a third electrode of the first conductivity type disposed in the first region, an impurity concentration of the first region being lower than an impurity concentration of the third electrode.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 Distance measurement module
110 Light-emitting unit
120 Control unit
130 Distance measurement computation unit
200 Light-receiving unit
210 Pixel array unit
220 Pixel circuit
221 Resistor
230 Read-out circuit
300 Photodiode
310 Anode electrode
320 Cathode electrode
330 Pinning region
340 Barrier region
350 Contact
360 Amplification region
361 N-layer
362 P-layer
370 Depletion layer
380 Insulating region
385 Cover film
390 Transistor
391 Metal layer
392 Oxide film
393 Semiconductor layer
401, 402 Substrate
410 Polishing device
12030 Vehicle exterior information detection unit

What is claimed is:
1. An avalanche photodiode sensor, comprising:
a photoelectric conversion region disposed in a substrate and that converts light incident to a first surface of the substrate into electric charge;
a first region of a first conductivity type on the photoelectric conversion region;
a cathode disposed in the substrate adjacent to the first region and coupled to the photoelectric conversion region;
an anode disposed in the substrate adjacent to the cathode;
a contact of the first conductivity type disposed in the substrate, an impurity concentration of the first region being different than an impurity concentration of the contact;
an insulating structure formed in the substrate between the photoelectric conversion region and an adjacent photoelectric conversion region; and
a film on the first surface of the substrate such that light passes through the film before being converted by the photoelectric conversion region into electric charge, wherein the film is on side surfaces of the insulating structure, wherein the cathode, the anode, and the contact are disposed at a same side of the substrate closer to a second surface of the substrate than the first surface of the substrate, the second surface of the substrate being opposite the first surface of the substrate.

2. The avalanche photodiode sensor of claim 1, wherein the impurity concentration of the first region is lower than the impurity concentration of the contact.

3. The avalanche photodiode sensor of claim 1, further comprising:
a second region of the first conductivity type disposed in the substrate and positioned between the photoelectric conversion region and the first region, wherein the impurity concentration of the first region is higher than an impurity concentration of the second region.

4. The avalanche photodiode sensor of claim 1, wherein the cathode is positioned between the anode and the first region.

5. The avalanche photodiode sensor of claim 1, wherein, in a plan view, the first region surrounds the contact, and the cathode surrounds the first region.

6. The avalanche photodiode sensor of claim 5, wherein, in the plan view, the anode surrounds the cathode.

7. The avalanche photodiode sensor of claim 6, wherein, in the plan view, the contact is located in a central area of the first region.

8. The avalanche photodiode sensor of claim 1, wherein the contact and the cathode are coupled to a first signal line that receives a first voltage, and wherein the anode is coupled to a second signal line that receives a second voltage.

9. The avalanche photodiode sensor of claim 1, wherein the anode, the cathode, and the first region are one of rectangular shaped or circle shaped.

10. The avalanche photodiode sensor of claim 1, wherein the cathode, the anode, and the contact are disposed in the second surface of the substrate.

11. An avalanche photodiode sensor, comprising:
a photoelectric conversion region disposed in a substrate and that converts incident light into electric charge;
a first region of a first conductivity type overlapping the photoelectric conversion region in a plan view;
a cathode disposed in the substrate adjacent to the first region and coupled to the photoelectric conversion region;
an anode disposed in the substrate adjacent to the cathode;
a contact of the first conductivity type disposed in the substrate, an impurity concentration of the first region being different than an impurity concentration of the contact, wherein the cathode, the anode, and the contact are disposed at a same side of the substrate; and
a transistor including:
a source and drain formed in the first region;
an oxide layer on the first region; and
a gate on the oxide layer.

12. An avalanche photodiode sensor, comprising:

a photoelectric conversion region disposed in a substrate and that converts incident light into electric charge;

a first region of a first conductivity type on the photoelectric conversion region;

a cathode disposed in the substrate adjacent to the first region and coupled to the photoelectric conversion region;

an anode disposed in the substrate adjacent to the cathode; and a contact of the first conductivity type disposed in the substrate, an impurity concentration of the first region being different than an impurity concentration of the contact, wherein the first region, the cathode, the anode, and the contact include portions that are in a same horizontal plane in a cross-sectional view, wherein, in a plan view, the first region surrounds the cathode, the contact surrounds the first region, and the anode surrounds the contact, and wherein the cathode, the anode, and the contact are disposed at a same side of the substrate.

13. The avalanche photodiode sensor of claim 12, wherein the first region surrounds a perimeter of the cathode, the contact surrounds a perimeter of the first region, and the anode surrounds a perimeter of the contact.

14. The avalanche photodiode sensor of claim 11, further comprising:

an insulating structure formed in the substrate and comprising a film between the photoelectric conversion region and an adjacent photoelectric conversion region, wherein the film is also on the substrate such that light incident to the photoelectric conversion region passes through the film on the substrate.

15. An avalanche photodiode sensor, comprising:

a photoelectric conversion region disposed in a substrate and that converts light incident to a first surface of the substrate into electric charge;

a first region of a first conductivity type disposed in the substrate;

a second region of the first conductivity type disposed in the substrate and positioned between the photoelectric conversion region and the first region;

an insulating structure formed in the substrate between the photoelectric conversion region and an adjacent photoelectric conversion region;

a cathode disposed in the substrate adjacent to the first region and coupled to the photoelectric conversion region;

an anode disposed in the substrate adjacent to the cathode;

a contact of the first conductivity type disposed in the first region, an impurity concentration of the first region being lower than an impurity concentration of the contact, wherein the cathode, the anode, and the contact are disposed at a same side of the substrate closer to a second surface of the substrate than the first surface of the substrate, the second surface of the substrate being opposite the first surface of the substrate; and a film on the first surface of the substrate such that light passes through the film before being converted by the photoelectric conversion region into electric charge, wherein the film is on side surfaces of the insulating structure.

16. The avalanche photodiode sensor of claim 15, wherein the impurity concentration of the first region is higher than an impurity concentration of the second region.

17. The avalanche photodiode sensor of claim 15, wherein, in a plan view, the first region surrounds the contact, and the cathode surrounds the first region.

* * * * *